(12) United States Patent
Ku et al.

(10) Patent No.: US 12,082,404 B2
(45) Date of Patent: Sep. 3, 2024

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Youngmo Ku, Seongnam-si (KR); Wookhyoung Lee, Seongnam-si (KR); Kang-Sup Roh, Osan-si (KR); Seongjun Seo, Hwaseong-si (KR); Yongin Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 436 days.

(21) Appl. No.: 17/557,501

(22) Filed: Dec. 21, 2021

(65) Prior Publication Data
US 2022/0352194 A1     Nov. 3, 2022

(30) Foreign Application Priority Data
Apr. 30, 2021    (KR) .......................... 10-2021-0056436

(51) Int. Cl.
*H10B 41/27*    (2023.01)
*H01L 23/522*   (2006.01)
*H10B 41/35*    (2023.01)
*H10B 43/27*    (2023.01)
*H10B 43/35*    (2023.01)
(Continued)

(52) U.S. Cl.
CPC ......... *H10B 41/27* (2023.02); *H01L 23/5226* (2013.01); *H10B 41/35* (2023.02); *H10B 43/27* (2023.02); *H10B 43/35* (2023.02); *H01L 24/32* (2013.01); *H01L 25/0657* (2013.01);
(Continued)

(58) Field of Classification Search
CPC ........ H10B 41/35; H10B 43/27; H10B 43/35; H10B 43/20; H10B 43/30; H10B 41/27; H10B 41/50; H10B 43/10; H10B 43/50; H10B 41/10; H01L 24/32; H01L 25/0657; H01L 25/105; H01L 2224/32145; H01L 2924/14511; H01L 24/05; H01L 24/18; H01L 24/49; H01L 23/5226; H01L 25/18; H01L 21/823475; H01L 2225/06544
See application file for complete search history.

(56) References Cited

U.S. PATENT DOCUMENTS 8,759,162 B2    6/2014    Wada et al.
9,825,047 B2    11/2017   Cho et al.
(Continued)

*Primary Examiner* — Victor A Mandala
(74) *Attorney, Agent, or Firm* — Myers Bigel, P.A.

(57) ABSTRACT

Disclosed is a semiconductor device comprising a substrate including a cell array region and a connection region, an electrode structure extending in a first direction on the substrate and including vertically stacked electrodes having pad sections arranged stepwise on the connection region, a first contact plug connected to a first one of the pad sections, a pair of first vertical structures that penetrate the first one of the pad sections and are spaced apart from each other in a first direction by a first distance, a second contact plug connected to a second one of the pad section and having a vertical length that is greater than that of the first contact plug, and a pair of second vertical structures that penetrate the second one of the pad sections and are spaced apart from each other in the first direction by a second distance that is greater than the first distance.

20 Claims, 21 Drawing Sheets

(51) Int. Cl.
    *H01L 23/00*     (2006.01)
    *H01L 25/065*    (2023.01)
    *H01L 25/10*     (2006.01)

(52) U.S. Cl.
    CPC .. *H01L 25/105* (2013.01); *H01L 2224/32145* (2013.01); *H01L 2924/14511* (2013.01)

(56) References Cited

U.S. PATENT DOCUMENTS

| | | |
|---|---|---|
| 9,899,406 B2 | 2/2018 | Kim et al. |
| 10,559,585 B2 * | 2/2020 | Kim .................... H01L 23/5226 |
| 10,777,577 B2 | 9/2020 | Cheon et al. |
| 11,631,690 B2 * | 4/2023 | Okina .................... H10B 41/50 |
| | | 257/314 |
| 2020/0119031 A1 | 4/2020 | Shen et al. |
| 2020/0303397 A1 * | 9/2020 | Cui ........................ H10B 43/27 |
| 2020/0312864 A1 * | 10/2020 | Iwai ....................... H10B 41/27 |
| 2022/0157842 A1 * | 5/2022 | Tsutsumi ............... H10B 43/35 |
| 2022/0189981 A1 * | 6/2022 | Sakotsubo ............. H10B 41/48 |
| 2023/0343641 A1 * | 10/2023 | Tirukkonda ........... H10B 41/10 |

\* cited by examiner

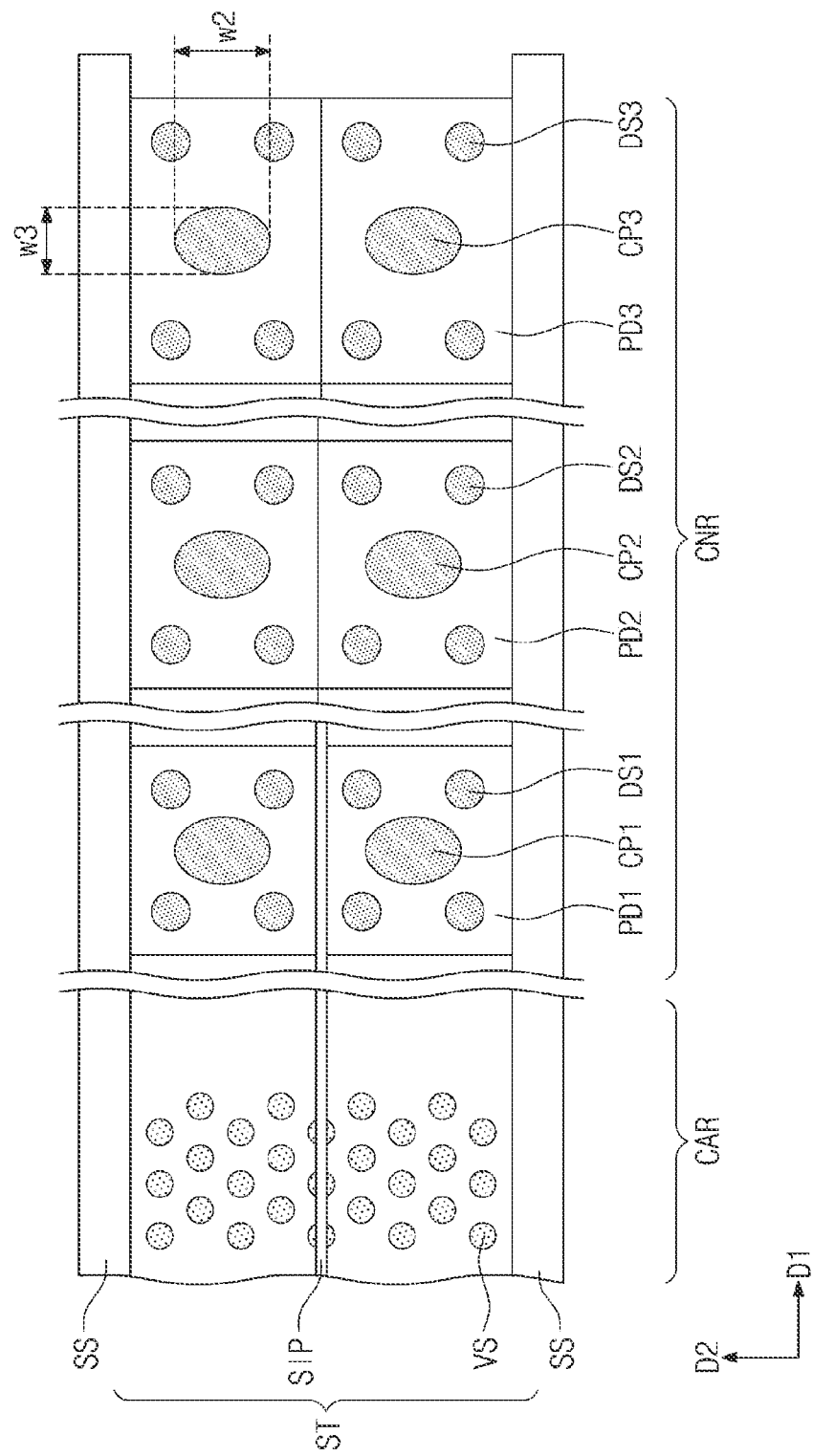

SEMICONDUCTOR DEVICE AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2021-0056436 filed on Apr. 30, 2021 in the Korean Intellectual Property Office, the disclosure of which is hereby incorporated by reference in its entirety.

BACKGROUND

The present inventive concepts relate to a semiconductor device and an electronic system including the same.

Semiconductor devices have been highly integrated to meet high performance and low manufacturing cost which are required by customers. Because integration of the semiconductor devices is an important factor in determining product price, high integration is increasingly requested. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor devices having three-dimensionally arranged memory cells.

SUMMARY

Some embodiments of the present inventive concepts provide a semiconductor device with increased reliability and integration.

Some embodiments of the present inventive concepts provide an electronic system including a semiconductor device.

According to some embodiments of the present inventive concepts, a semiconductor device may comprise: a substrate that includes a cell array region and a connection region; an electrode structure that extends in a first direction on the substrate, the electrode structure including a plurality of electrodes that are vertically stacked, the electrodes having pad sections that are arranged stepwise on the connection region; a first contact plug connected to a first one of the pad sections; a pair of first vertical structures that penetrate the first one of the pad sections and are spaced apart from each other in the first direction by a first distance; a second contact plug connected to a second one of the pad sections and having a vertical length that is greater than a vertical length of the first contact plug; and a pair of second vertical structures that penetrate the second one of the pad sections and are spaced apart from each other in the first direction by a second distance. The second distance may be greater than the first distance.

According to some embodiments of the present inventive concepts, a semiconductor device may comprise: a substrate that includes a cell array region and a connection region; an electrode structure that extends in a first direction on the substrate, the electrode structure including a plurality of electrodes and a plurality of dielectric layers that are alternately stacked, the electrodes having pad sections that are arranged stepwise on the connection region; a plurality of channel structures that penetrate the electrodes on the cell array region; a separation dielectric pattern that extends in the first direction between the channel structures, the separation dielectric pattern penetrating ones of the electrodes, the ones of the electrodes being on an upper portion of the electrode structure; a first contact plug connected to a first one of the pad sections, the first one of the pad sections being at a level higher than a level of a bottom end of the separation dielectric pattern; at least a pair of first vertical structures that penetrate the first one of the pad sections and are spaced apart from each other in the first direction; a second contact plug electrically connected to a lowermost one of the electrodes, the second contact plug being connected to a second one of the pad sections; and at least a pair of second vertical structures that penetrate the second one of the pad sections and are spaced apart from each other in the first direction. A distance in the first direction between the second vertical structures may be greater than a distance in the first direction between the first vertical structures.

According to some embodiments of the present inventive concepts, an electronic system may comprise: a main board; a semiconductor device on the main board; and a controller on the main board and electrically connected to the semiconductor device. The semiconductor device may comprise: a substrate that includes a cell array region and a connection region that faces in a first direction to the cell array region; an electrode structure that includes a plurality of electrodes stacked on the substrate, the electrode structure having a plurality of stepwise pad sections on the connection region; a first contact plug connected to a first one of the pad sections; a plurality of first vertical structures that penetrate the first one of the pad sections; a second contact plug connected to a second one of the pad sections and having a vertical length that is greater than a vertical length of the first contact plug; and a plurality of second vertical structures that penetrate the second one of the pad sections. A distance in the first direction between the second vertical structures may be greater than a distance in the first direction between the first vertical structures.

Details of other example embodiments are included in the description and drawings.

BRIEF DESCRIPTION OF THE DRAWINGS

FIGS. 12A to 12C illustrate plan views showing a semiconductor device according to some embodiments of the present inventive concepts.

DETAILED DESCRIPTION OF EMBODIMENTS

The following will now describe some embodiments of the present inventive concepts in conjunction with the accompanying drawings.

Figure 1:
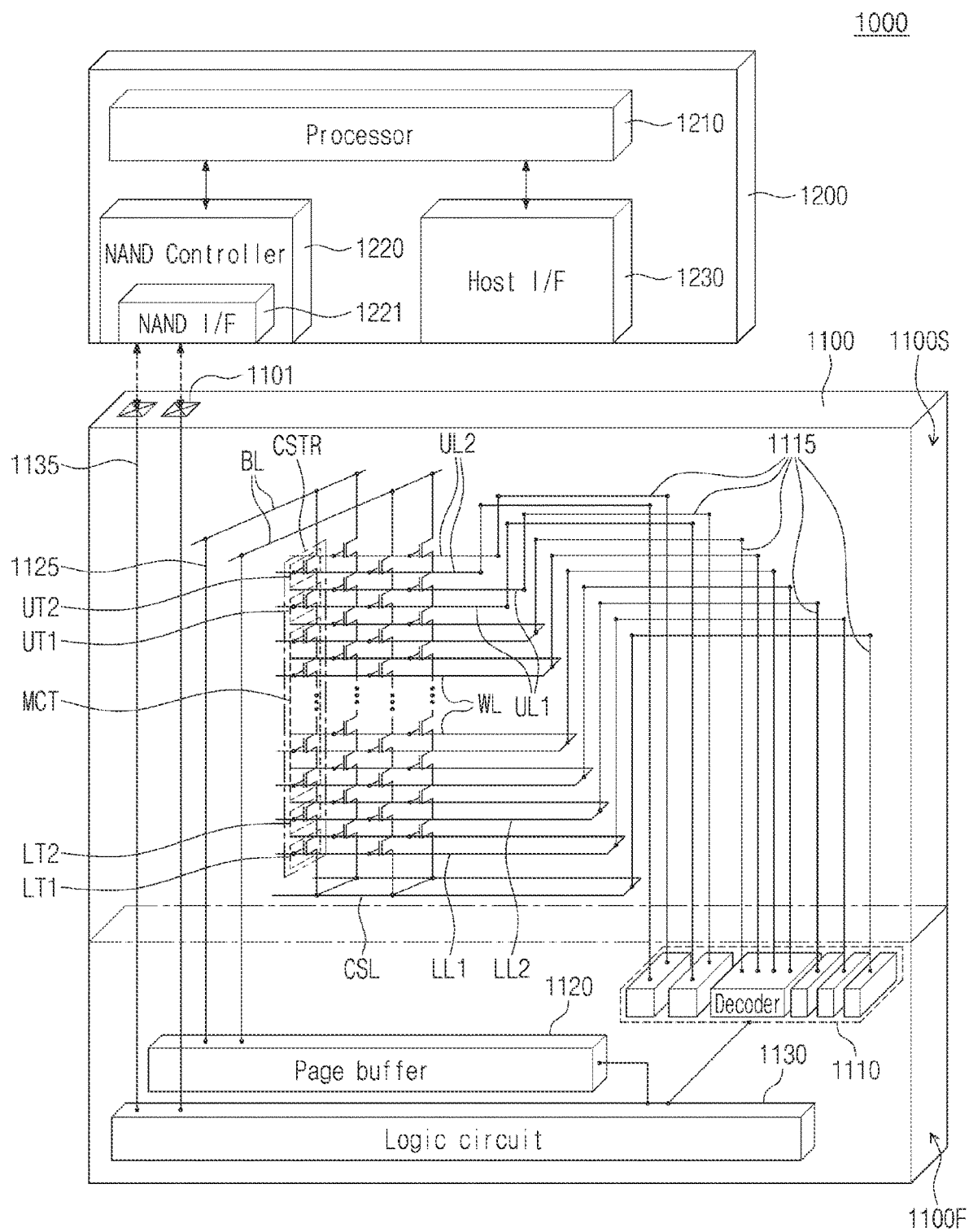
FIG. 1 illustrates a simplified schematic diagram showing an electronic system including a semiconductor device according to some embodiments of the present inventive concepts.

FIG. 1 illustrates a simplified schematic diagram showing an electronic system including a semiconductor device according to some embodiments of the present inventive concepts.

Referring to FIG. 1, an electronic system 1000 according to some embodiments of the present inventive concepts may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as an NAND Flash memory device. The semiconductor device 1100 may include a first structure 1100F and a second structure 1100S on the first structure 1100F. For example, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure that includes bit lines BL, a common source line CSL, word lines WL, first and second gate upper lines UL1 and UL2, first and second gate lower lines LL1 and LL2, and memory cell strings CSTR between the bit line BL and the common source line CSL.

For the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

For the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate based on predetermined firmware and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
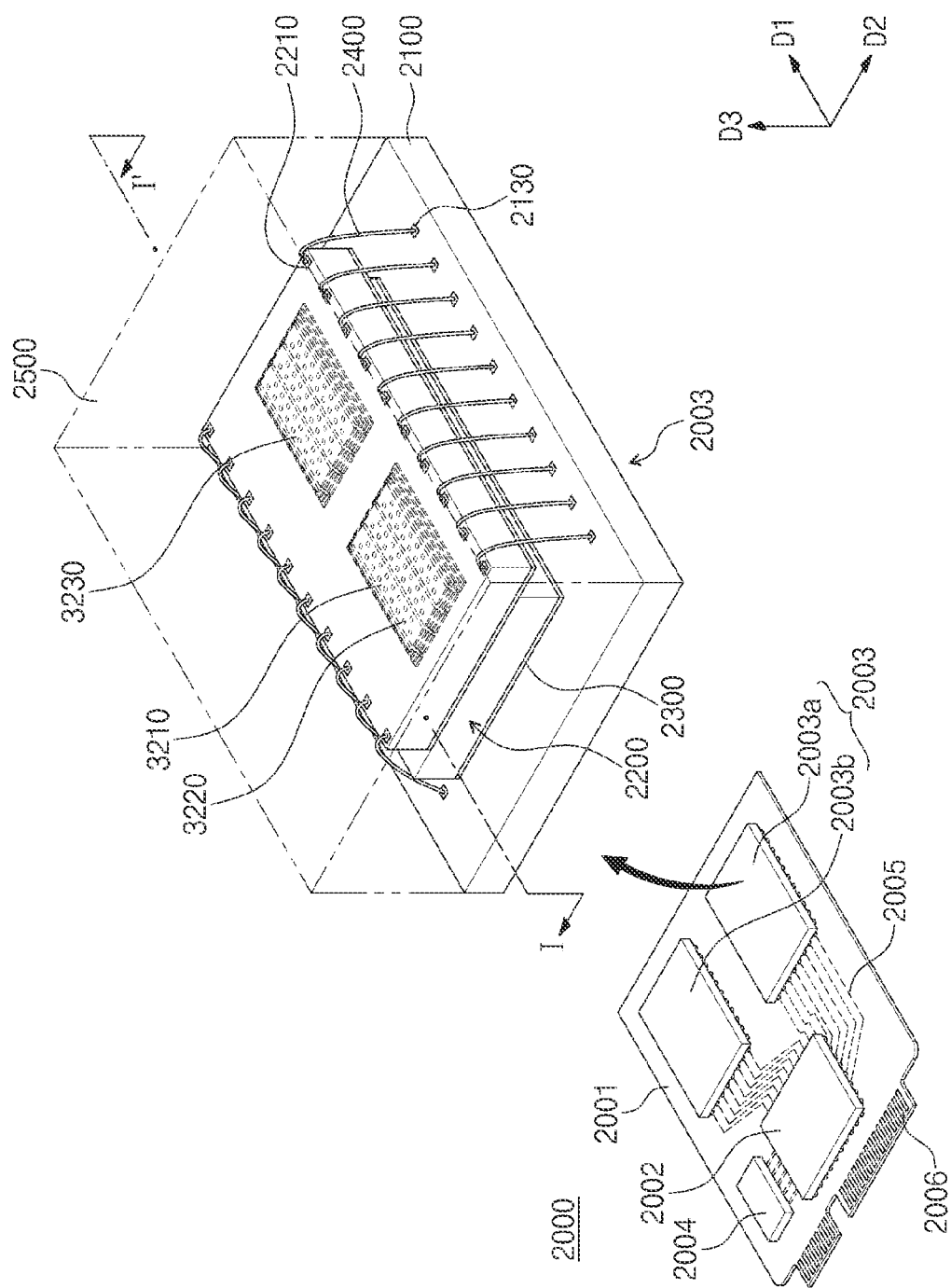
FIG. 2 illustrates a simplified perspective view showing an electronic system including a semiconductor device according to some embodiments of the present inventive concepts.

FIG. 2 illustrates a simplified perspective view showing an electronic system including a semiconductor device according to some embodiments of the present inventive concepts.

Referring to FIG. 2, an electronic system 2000 according to some embodiments of the present inventive concepts may include a main board 2001, and may also include a controller 2002, at least one semiconductor package 2003, and a dynamic random access memory (DRAM) 2004 each of which is mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from an external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a cache memory and may provide a space for temporary data storage in a control operation of the semiconductor package 2003. When the DRAM 2004 is included in the electronic system 2000, the controller 2002 may include not only an NAND controller for controlling the semiconductor package 2003, but a DRAM controller for controlling the DRAM 2004.

The semiconductor package 2003 may include first and second semiconductor packages 2003*a* and 2003*b* that are spaced apart from each other. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesive layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including upper pads 2130. Each of the semiconductor chips 2200 may include one or more input/output pads 2210. The input/output pad 2210 may correspond to the input/output pad 1101 of FIG. 1. Each of the semiconductor chips 2200 may include stack structures 3210 and vertical structures 3220. Each of the semiconductor chips 2200 may include a semiconductor device according to some embodiments of the present inventive concepts which will be discussed below.

In some embodiments, the connection structures 2400 may be bonding wires that electrically connect the input/output pads 2210 to the upper pads 2130 On each of the first and second semiconductor packages 2003*a* and 2003*b*, the semiconductor chips 2200 may be electrically connected to each other in a wire bonding manner, and may be electrically connected to the upper pads 2130 of the package substrate 2100. In some embodiments, on each of the first and second semiconductor packages 2003*a* and 2003*b*, the semiconductor chips 2200 may be electrically connected to each other through connection structures such as through silicon vias (TSV) instead of the connection structures 2400 shaped like bonding wires.

In some embodiments, the controller 2002 and the semiconductor chips 2200 may be included in a single package. For example, the controller 2002 and the semiconductor chips 2200 may be mounted on an interposer substrate other than the main board 2001 and may be connected to each other through wiring lines provided in the interposer substrate.

Figure 3:
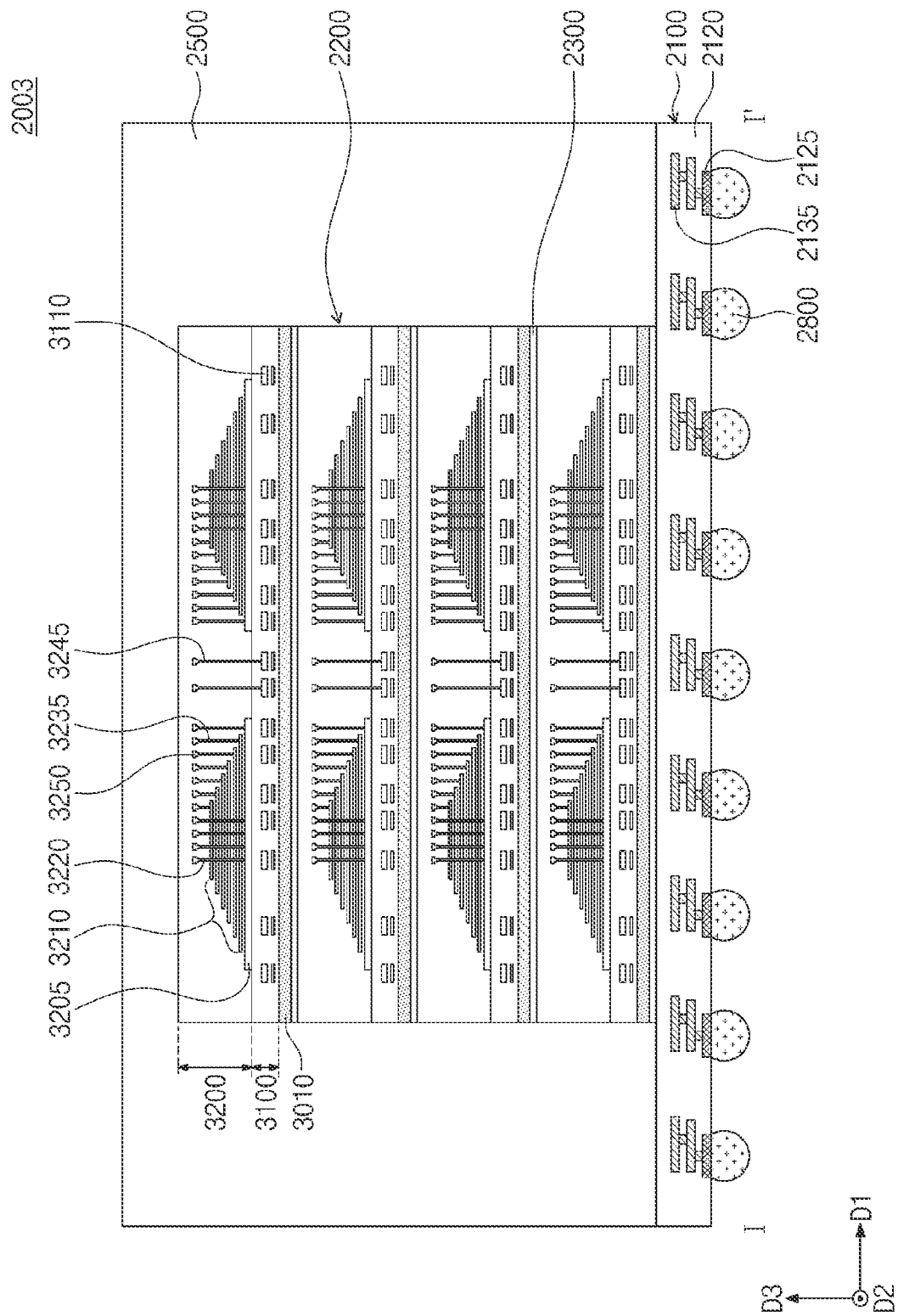
FIGS. 3 and 4 illustrate simplified cross-sectional views showing a semiconductor package according to some embodiments of the present inventive concepts.
Figure 4:
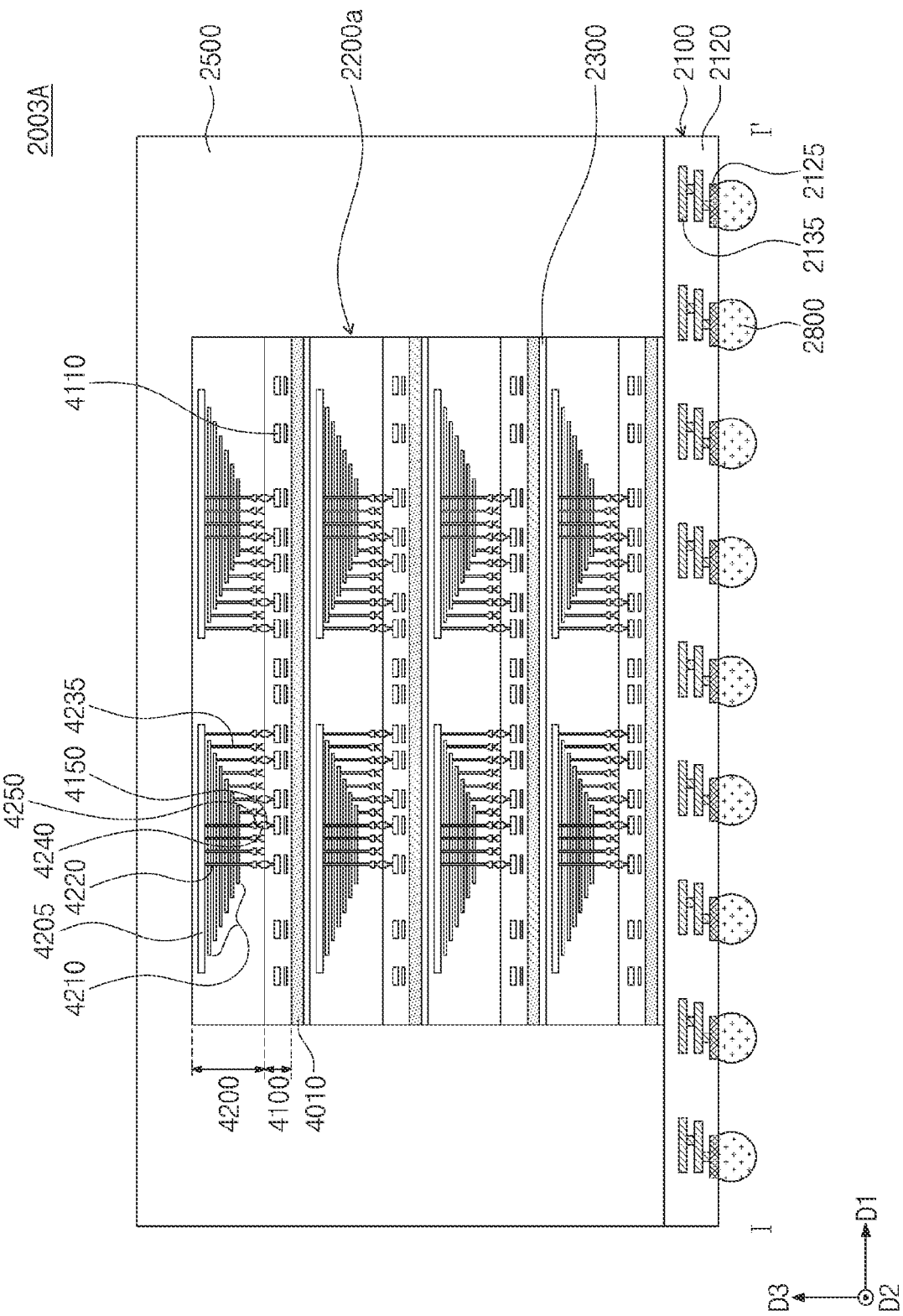

FIGS. 3 and 4 illustrate simplified cross-sectional views showing a semiconductor package according to some embodiments of the present inventive concepts. FIGS. 3 and 4 each depicts an example of the semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, upper pads (see 2130 of FIG. 2) disposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The lower pads 2125 may be connected through conductive connectors 2800 to the wiring patterns 2005 of the main board 2001 in the electronic system 2000, as shown in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 that penetrate the stack structure 3210, bit lines 3250 electrically connected to the vertical structures 3220, and cell contact plugs 3235 electrically connected to word lines (see WL of FIG. 1) of the stack structure 3210. The second structure 3200 may further include separation structures (see 3230 of FIG. 2) which will be discussed below.

Each of the semiconductor chips 2200 may include one or more through lines 3245 that have electrical connection with the peripheral wiring lines 3110 of the first structure 3100 and extend into the second structure 3200. The through line 3245 may be disposed outside the stack structure 3210 or may be disposed to penetrate the stack structure 3210. Each of the semiconductor chips 2200 may further include one or more input/output pads (see 2210 of FIG. 2) electrically connected to the peripheral wiring lines 3110 of the first structure 3100. Referring to FIG. 4, a semiconductor package 2003A may be configured such that each of semiconductor chips 2200a may include a semiconductor substrate 4010, a first structure 4100 on the semiconductor substrate 4010, and a second structure 4200 disposed on and waferbonded to the first structure 4100.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 that penetrate the stack structure 4210, and second bonding structures 4240 electrically connected to the vertical structures 4220 and word lines (see WL of FIG. 1) of the stack structure 4210. For example, the second bonding structures 4240 may be electrically connected to the vertical structures 4220 through bit lines 4250 electrically connected to the vertical structures 4220, and may also be electrically connected to the word lines (see WL of FIG. 1) through cell contact plugs 4235 electrically connected to the word lines (see WL of FIG. 1). The first bonding structures 4150 of the first structure 4100 and the second bonding structures 4240 of the second structure 4200 may be coupled to each other while being in contact with each other. The first and second bonding structures 4150 and 4240 may have their bonding portions formed of, for example, copper (Cu). Each of the semiconductor chips 2200a may further include one or more input/output pads (see 2210 of FIG. 2) electrically connected to the peripheral wiring lines 4110.

The semiconductor chips 2200 of FIG. 3 may be electrically connected to each other through connection structures (see 2400 of FIG. 2) shaped like bonding wires, and this description may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes such as through silicon vias (TSV).

The first structure 3100 of FIG. 3 and the first structure 4100 of FIG. 4 may correspond to a peripheral circuit structure which will be discussed below, and the second structure 3200 of FIG. 3 and the second structure 4200 of FIG. 4 may correspond to a cell array structure which will be discussed below.

Figure 5:
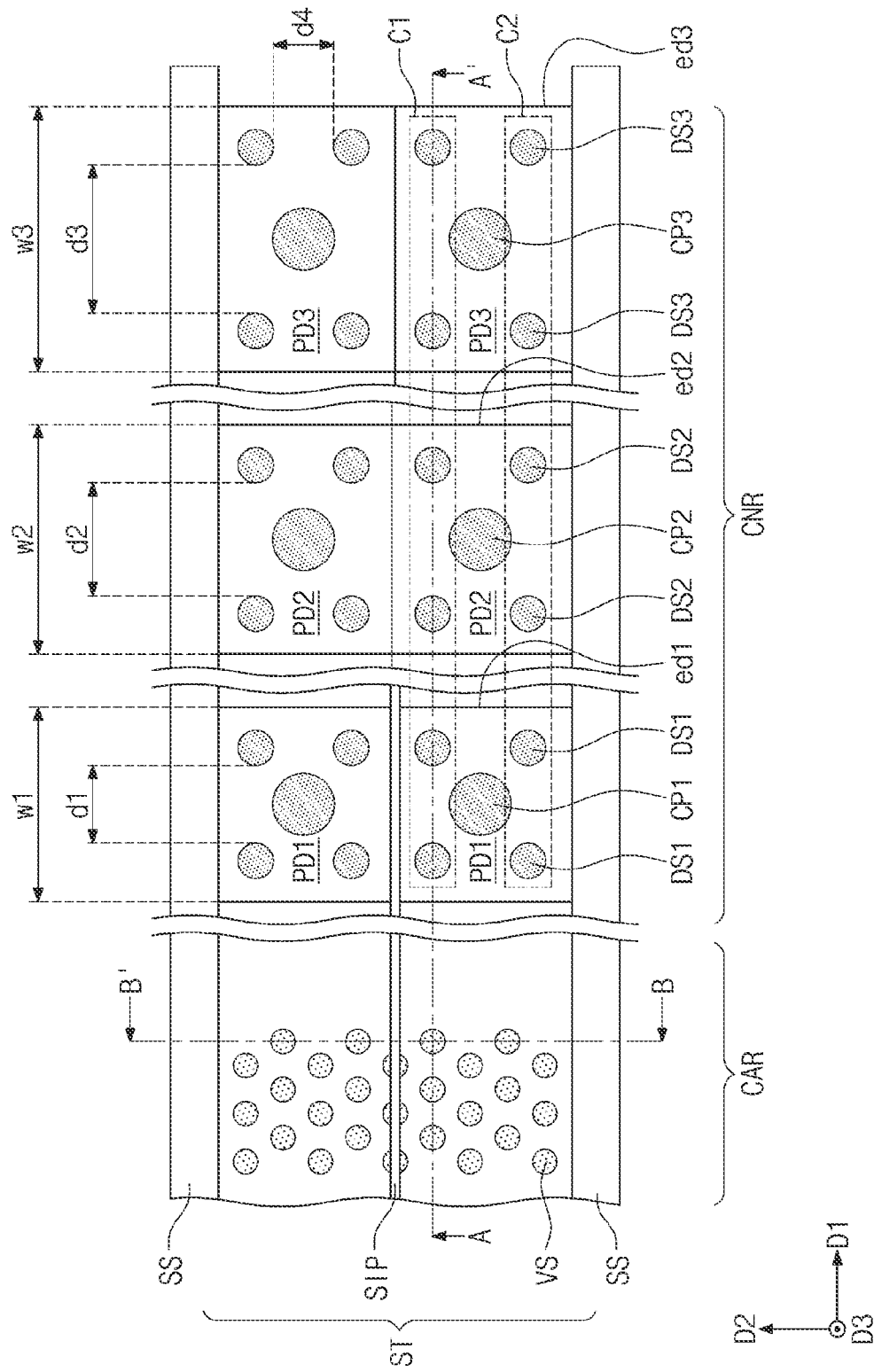
FIG. 5 illustrates a plan view showing a semiconductor device according to some embodiments of the present inventive concepts.
Figure 6:
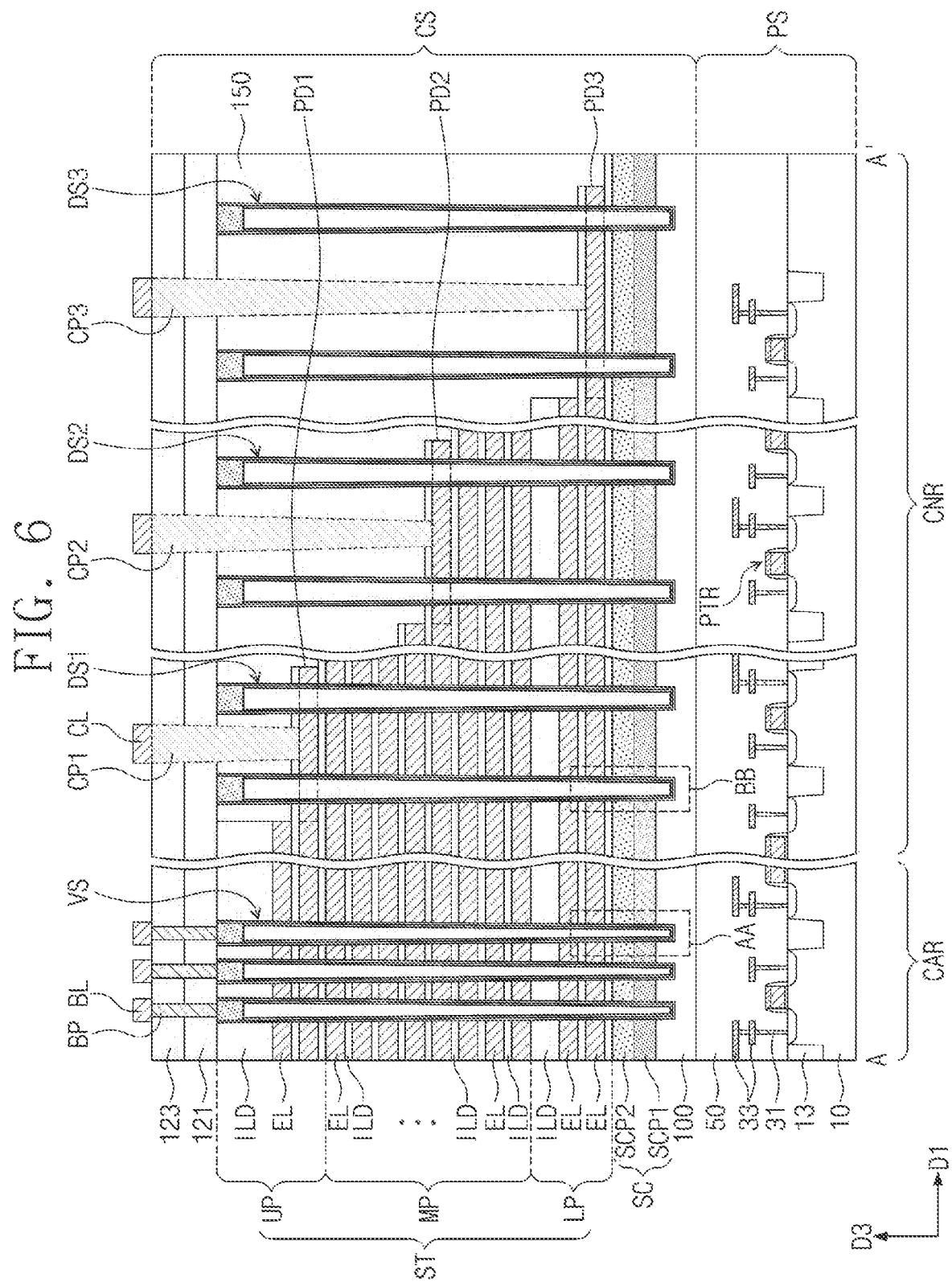
FIGS. 6 and 7 illustrate cross-sectional views respectively taken along lines A-A' and B-B' of FIG. 4, showing a semiconductor device according to some embodiments of the present inventive concepts.
Figure 7:
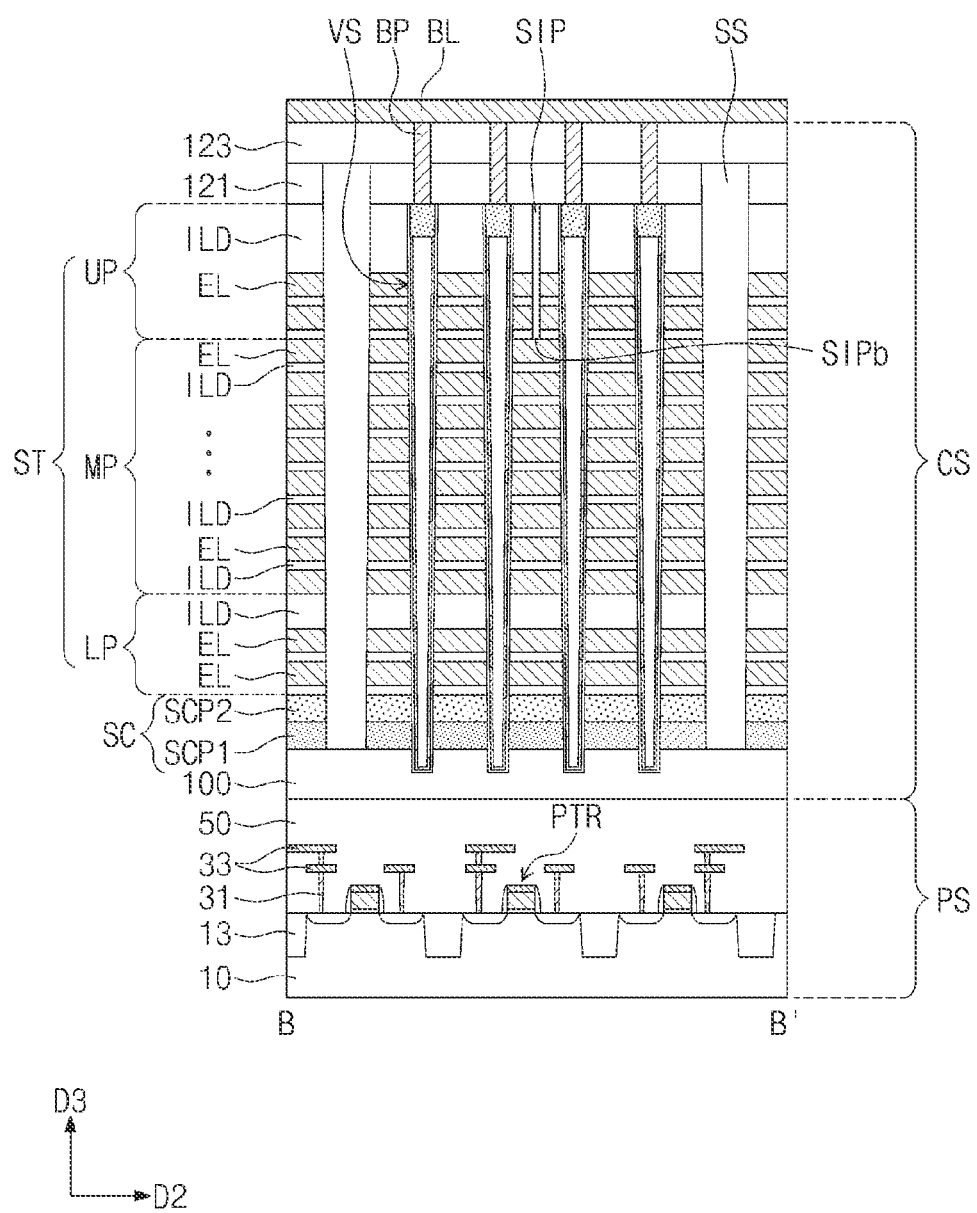
Figure 8:
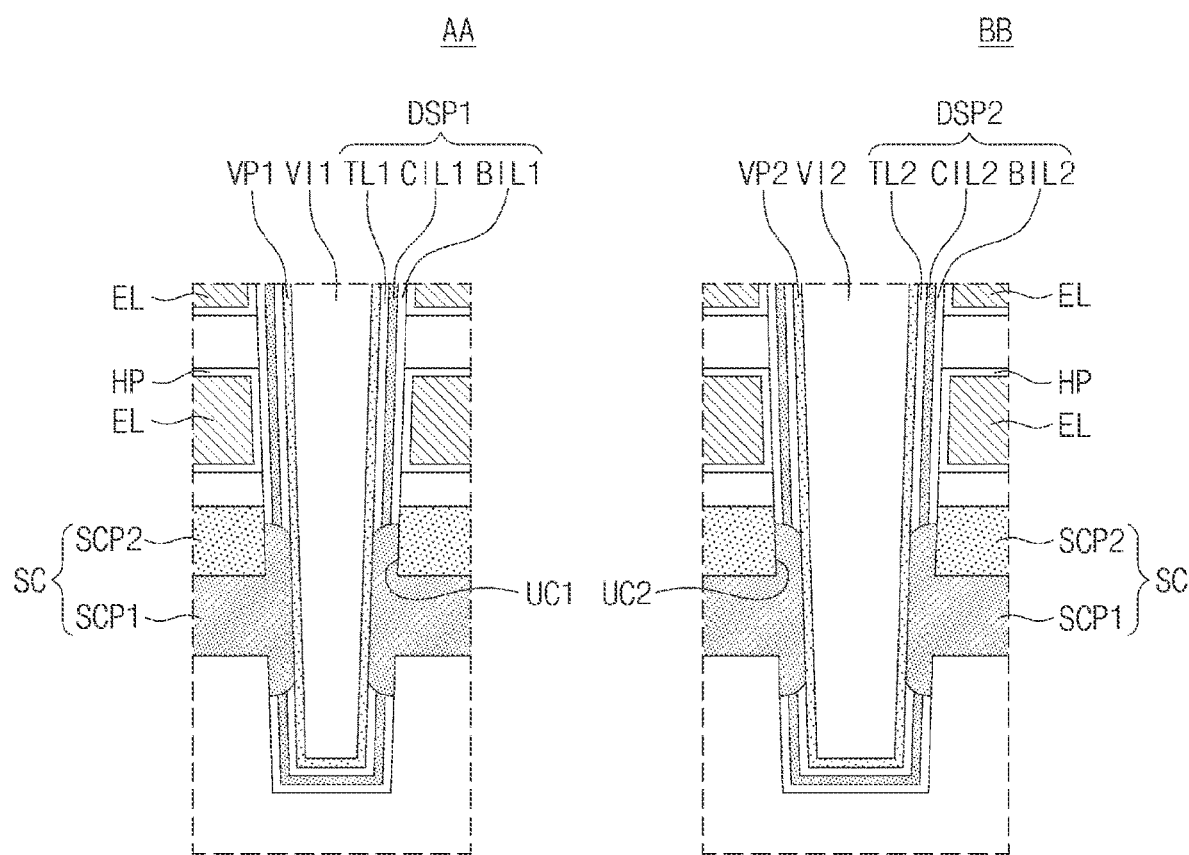
FIG. 8 illustrates an enlarged cross-sectional view showing sections AA and BB of FIG. 6.

FIG. 5 illustrates a plan view showing a semiconductor device according to some embodiments of the present inventive concepts. FIGS. 6 and 7 illustrate cross-sectional views respectively taken along lines A-A' and B-B' of FIG. 4, showing a semiconductor device according to some embodiments of the present inventive concepts. FIG. 8 illustrates an enlarged cross-sectional view showing sections AA and BB of FIG. 6.

Referring to FIGS. 5 to 7, a peripheral circuit structure PS may be provided which includes a lower substrate 10 and peripheral transistors PTR. The peripheral circuit structure PS may be provided thereon with a cell array structure CS that includes an electrode structure ST. The lower substrate 10 may be a silicon substrate, a silicon-germanium substrate, a germanium substrate, or a monocrystalline epitaxial layer grown on a monocrystalline silicon substrate. The lower substrate 10 may include active regions defined by a device isolation layer 13. The peripheral transistors PTR may constitute a decoder circuit, a page buffer, and a logic circuit that are discussed with reference to FIG. 1.

The peripheral circuit structure PS may include lower wiring lines 33 provided on the peripheral transistors PTR, and also include a lower dielectric layer 50 that covers the peripheral transistors PTR and the lower wiring lines 33. One or more peripheral contacts 31 may be provided between the lower wiring lines 33 and the peripheral transistors PTR. The peripheral contacts 31 may electrically connect the lower wiring lines 33 to the peripheral transistors PTR. The lower dielectric layer 50 may include a plurality of stacked dielectric layers. The lower dielectric layer 50 may include, for example, one or more of a silicon oxide layer, a silicon nitride layer, a silicon oxynitride layer, and a low-k dielectric layer.

The cell array structure CS may be disposed on the lower dielectric layer 50. The cell array structure CS may include a lower semiconductor layer 100, a source structure SC, an electrode structure ST, channel structures VS, and vertical structures DS1, DS2, and DS3. According to some embodiments, the memory cell strings (see CSTR of FIG. 1) may be integrated on the lower semiconductor layer 100. The electrode structure ST and the channel structures VS may constitute the memory cell strings CSTR shown in FIG. 1.

The lower semiconductor layer 100 may be located on a top surface of the lower dielectric layer 50. The lower semiconductor layer 100 may include a semiconductor material, such as silicon (Si), germanium (Ge), silicon germanium (SiGe), gallium arsenide (GaAs), indium gallium aresenide (InGaAs), aluminum gallium arsenide (AlGaAs), or a mixture thereof. Additionally or alternatively, the lower semiconductor layer 100 may include one or more of a semiconductor doped with impurities having a first conductivity type and an intrinsic semiconductor with no doped impurities. The first conductivity type may be, for example, n-type. The lower semiconductor layer 100 may have at least one selected from a monocrystalline structure, an amorphous structure, and a polycrystalline structure. The lower semiconductor layer 100 may have a top surface that extends in a first direction D1 and a second direction D2 orthogonal to the first direction D1. The lower semiconductor layer 100 may include a cell array region CAR and a connection region CNR that are formed along the first direction D1.

The source structure SC may be located between the electrode structure ST and the lower semiconductor layer 100. The source structure SC may be parallel to the top surface of the lower semiconductor layer 100, and may extend in the first and second directions D1 and D2 parallel to the electrode structure ST. The source structure SC may include a first horizontal pattern SCP1 and a second horizontal pattern SCP2 on the first horizontal pattern SCP1. The first horizontal pattern SCP1 and the second horizontal pattern SCP2 may be sequentially stacked on the lower semiconductor layer 100. Each of the first and second horizontal patterns SCP1 and SCP2 may include a semiconductor material doped with impurities having the first conductivity type. For example, the first and second horizontal patterns SCP1 and SCP2 may include a semiconductor material doped with n-type impurities. The impurities may include, for example, phosphorus (P) or arsenic (As). According to some embodiments, a concentration of n-type impurities included in the first horizontal pattern SCP1 may be greater than that of n-type impurities included in the second horizontal pattern SCP2.

The electrode structure ST may be located on the lower semiconductor layer 100. The electrode structure ST may be positioned between separation structures SS that parallel extend in the first direction D1. The electrode structure ST may be spaced apart from the lower semiconductor layer 100 across the source structure SC. The electrode structure ST may extend along the first direction D1 from the cell array region CAR toward the connection region CNR.

The electrode structure ST may include electrodes EL stacked in a direction (e.g., third direction D3) perpendicular to the top surface of the lower semiconductor layer 100, and also include dielectric layers ILD stacked alternately with the electrodes EL. The electrodes EL may have substantially the same thickness, and the dielectric layers ILD may have their thicknesses that are changed depending on characteristics of a semiconductor device. Each thickness of the dielectric layers ILD may be less than that of the electrodes EL. The electrodes EL may be positioned between the separation structures SS. The separation structures SS may separate the electrodes EL in the electrode structure ST from other electrodes in a neighboring electrode structure. According to some embodiments, the separation structures SS may be filled with a dielectric material. Each of the electrodes EL may include at least one selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). Each of the dielectric layers ILD may include a silicon oxide layer.

The electrode structure ST may have a stepwise structure on the connection region CNR. The higher level of the electrode EL in the electrode structure ST, the greater length in the first direction D1 of the electrode EL in the electrode structure ST. The electrode structure ST may have a height that decreases with increasing distance from the cell array region CAR. The electrode structure ST may include a lower part LP, a middle part MP, and an upper part UP each of which includes a plurality of electrodes EL. According to some embodiments, the lower part LP may include an erase control gate electrode adjacent to the source structure SC and a ground selection gate electrode on the erase control gate electrode. The electrodes EL in the middle part MP may include cell gate electrodes. The electrodes EL in the upper part UP may include string selection gate electrodes.

The electrodes EL of the electrode structure ST may have pad sections PD1, PD2, and PD3 that are arranged stepwise on the connection region CNR. Each of the pad sections PD1, PD2, and PD3 may be exposed by the electrode EL that is positioned immediately thereon. The stepwise structure of the electrode structure ST may be changed based on arrangement of the pad sections PD1, PD2, and PD3. The pad sections PD1, PD2, and PD3 may be arranged along the first and second directions D1 and D2 and may be located at positions horizontally different from each other. Each of the pad sections PD1, PD2, and PD3 may not overlap any other one of the pad sections PD1, PD2, and PD3. The pad sections PD1, PD2, and PD3 may be portions of the electrodes EL for individual connections between the electrodes EL and a decoder circuit. The pad sections PD1, PD2, and PD3 may be electrically connected to connection lines CL through contact plugs CP1, CP2, and CP3.

A separation dielectric pattern SIP may be formed on the upper part UP of the electrode structure ST. The separation dielectric pattern SIP may extend in the first direction D1 and penetrate the electrodes EL in the upper part UP. For example, the separation dielectric pattern SIP may separate the electrodes EL in the upper part UP from each other in the second direction D2. The separation dielectric pattern SIP may overlap ones of the channel structures VS. The separation dielectric pattern SIP may include a dielectric material. The separation dielectric pattern SIP may be positioned on an uppermost one of the electrodes EL in the middle part MP. For example, the separation dielectric pattern SIP may not penetrate the electrodes EL in the middle part MP.

A planarized dielectric layer 150 may cover stepwise ends of the electrode structure ST. For example, the planarized dielectric layer 150 may cover the pad sections PD1, PD2, and PD3 of the electrodes EL. The planarized dielectric layer 150 may have a substantially flat top surface. The planarized dielectric layer 150 may be located at the same level as that of a top surface of an uppermost dielectric layer ILD. The planarized dielectric layer 150 may include a single dielectric layer or a plurality of stacked dielectric layers.

A first interlayer dielectric layer 121 and a second interlayer dielectric layer 123 may be sequentially stacked on the electrode structure ST and the planarized dielectric layer 150. The first interlayer dielectric layer 121 may cover top surfaces of the channel structures VS and top surfaces of the vertical structures DS1, DS2, and DS3.

Bit-line contact plugs BP may penetrate the first and second interlayer dielectric layers 121 and 123, and may connect bit lines BL to the channel structures VS. The bit lines BL may be disposed on a top surface of the second interlayer dielectric layer 123, while extending in the second direction D2.

The contact plugs CP1, CP2, and CP3 may penetrate the first interlayer dielectric layer 121, the second interlayer dielectric layer 123, and the planarized dielectric layer 150, thereby being coupled to the pad sections PD1, PD2, and PD3. The contact plugs CP1, CP2, and CP3 may connect the pad sections PD1, PD2, and PD3 to the connection lines CL positioned on the second interlayer dielectric layer 123. The contact plugs CP1, CP2, and CP3 may have their vertical lengths that are different in accordance with vertical levels of the pad sections PD1, PD2, and PD3. According to some embodiments, the pad sections PD1, PD2, and PD3 may include a first pad section PD1 positioned on the upper part UP of the electrode structure ST, a second pad section PD2 positioned on the middle part MP of the electrode structure ST, and a third pad section PD3 positioned on the lower part LP of the electrode structure ST. A first contact plug CP1 connected to the first pad section PD1 may have a vertical length less than that of a second contact plug CP2 connected to the second pad section PD2. The vertical length of the second contact plug CP2 connected to the second pad section PD2 may be less than that of a third contact plug CP3 connected to the third pad section PD3.

The pad sections PD1, PD2, and PD3 may have their lengths in the first direction D1 that are different in accordance with distances to the cell array region CAR. The second pad section PD2 may have a length w2 in the first direction D1 that is greater than a length w1 in the first direction D1 of the first pad section PD1. The third pad section PD3 may have a length w3 in the first direction D1 that is greater than the length w2 in the first direction D1 of the second pad section PD2. The pad sections PD1, PD2, and PD3 may have their widths in the second direction D2 that are constant regardless of distance to the cell array region CAR. The pad sections PD1, PD2, and PD3 may have the same width in the second direction D2. The width in the second direction D2 of the pad sections PD1, PD2, and PD3 may be less than each length in the first direction D1 of the pad sections PD1, PD2, and PD3. For example, when the length w1 in the first direction D1 of the first pad section PD1 is less than any other length in the first direction D1 of the pad sections PD1, PD2, and PD3, the width in the second direction D2 of the first pad section PD1 may be less than the length w1 in the first direction D1 of the first pad section PD1.

On the connection region CNR, the vertical structures DS1, DS2, and DS3 may be provided to penetrate the electrode structure ST. The vertical structures DS1, DS2, and DS3 may penetrate the stepwise structure of the electrode structure ST. The vertical structures DS1, DS2, and DS3 may each have a width in the first direction D1 that is greater than a width in the first direction D1 of each of the channel structures VS. For example, the vertical structures DS1, DS2, and DS3 may each have a circular shape when viewed in plan, and may each have a diameter that is greater than that of each of the channel structures VS. The vertical structures DS1, DS2, and DS3 may each serve as a pillar (or supporter) that physically supports the stepwise structure.

Referring to FIGS. 6 and 8, each of the channel structures VS may include a first filling dielectric pattern VI1, a first vertical semiconductor pattern VP1, and a data storage layer DSP1. The data storage layer DSP1 may include a tunnel dielectric layer TL1, a charge storage layer CIL2, and a blocking dielectric layer BIL1. The data storage layer DSP1 may be a data storage layer for NAND Flash memory device. Each of the vertical structures DS1, DS2, and DS3 may include a second filling dielectric layer VI2, a second vertical semiconductor pattern VP2, and a dummy data storage layer DSP2. The dummy storage layer DSP2 may include a dummy tunnel dielectric layer TL2, a dummy charge storage layer CIL2, and a dummy blocking dielectric layer BIL2. According to some embodiments, the second vertical semiconductor pattern VP2 and the dummy data storage layer DSP2 of each of the vertical structures DS1, DS2, and DS3 may be a dummy member that has no circuit function. A first undercut UC1 may separate the data storage layer DSP1 into upper and lower segments, and likewise a second undercut UC2 may separate the dummy data storage layer DSP2 into upper and lower segments. The first and second undercuts UC1 and UC2 may be filled with the first horizontal pattern SCP1.

Referring to FIGS. 5 to 7, the vertical structures DS1, DS2, and DS3 may include first vertical structures DS1 on the first pad section PD1, second vertical structures DS2 on the second pad section PD2, and third vertical structures DS3 on the third pad section PD3. The first vertical structures DS1, the second vertical structures DS2, and the third vertical structures DS3 may be aligned in the first direction D1 to constitute a plurality of columns C1 and C2. According to some embodiments, two columns C1 and C2 may be constituted by the vertical structures DS1, DS2, and DS3 on the pad sections PD1, PD2, and PD3 that are arranged in the first direction D1. Each of the columns C1 and C2 may have a pair of first vertical structures DS1, a pair of second vertical structures DS2, and a pair of third vertical structures DS3. In each of the columns C1 and C2, the first vertical structures DS1, the second vertical structures DS2, and the third vertical structures DS3 may be spaced apart from each other in the first direction D1.

A pair of first vertical structures DS1 in a first column C1 may be spaced apart in the second direction D2 from another pair of first vertical structures DS1 in a second column C2. A pair of second vertical structures DS2 in the first column C1 may be spaced apart in the second direction D2 from another pair of second vertical structures DS2 in the second column C2. A pair of third vertical structures DS3 in the first column C1 may be spaced apart in the second direction D2 from another pair of third vertical structures DS3 in the second column C2.

At least a pair of first vertical structures DS1 spaced apart from each other in the first direction D1 may penetrate the first pad section PD1. The first vertical structures DS1 may penetrate the electrodes EL positioned below the first pad section PD1 and extend downwards from the top surface of the lower semiconductor layer 100. A pair of first vertical structures DS1 may be spaced apart from each other in the first direction D1 by a first distance d1.

At least a pair of second vertical structures DS2 spaced apart from each other in the first direction D1 may penetrate the second pad section PD2. The second vertical structures DS2 may penetrate the electrodes EL positioned below the second pad section PD2 and extend downwards from the top surface of the lower semiconductor layer 100. A pair of second vertical structures DS2 may be spaced apart from each other in the first direction D1 by a second distance d2 that is greater than the first distance d1.

At least a pair of third vertical structures DS3 spaced apart from each other in the first direction D1 may penetrate the third pad section PD3. The third vertical structures DS3 may penetrate the electrodes EL positioned below the third pad section PD3 and extend downwards from the top surface of the lower semiconductor layer 100. A pair of third vertical structures DS3 may be spaced apart from each other in the first direction D1 by a third distance d3 that is greater than the second distance d2.

The vertical structures DS1, DS2, and DS3 in the first column C1 may be spaced apart at a fourth distance d4 from the vertical structures DS1, DS2, and DS3 in the second column C2. The fourth distance d4 may be less than the first distance d1.

Figure 9:
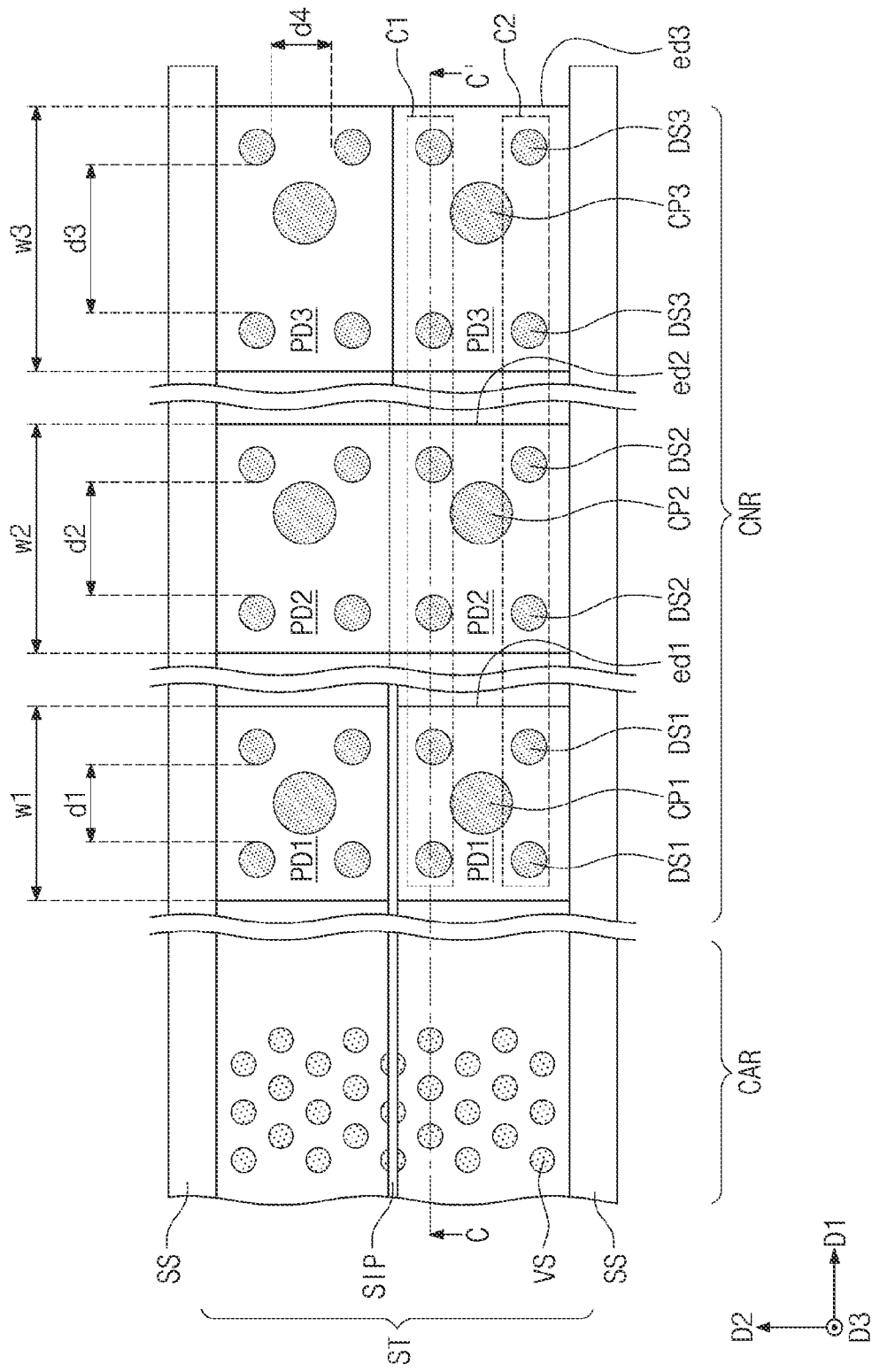
FIG. 9 illustrates a plan view showing a semiconductor device according to some embodiments of the present inventive concepts.
Figure 10:
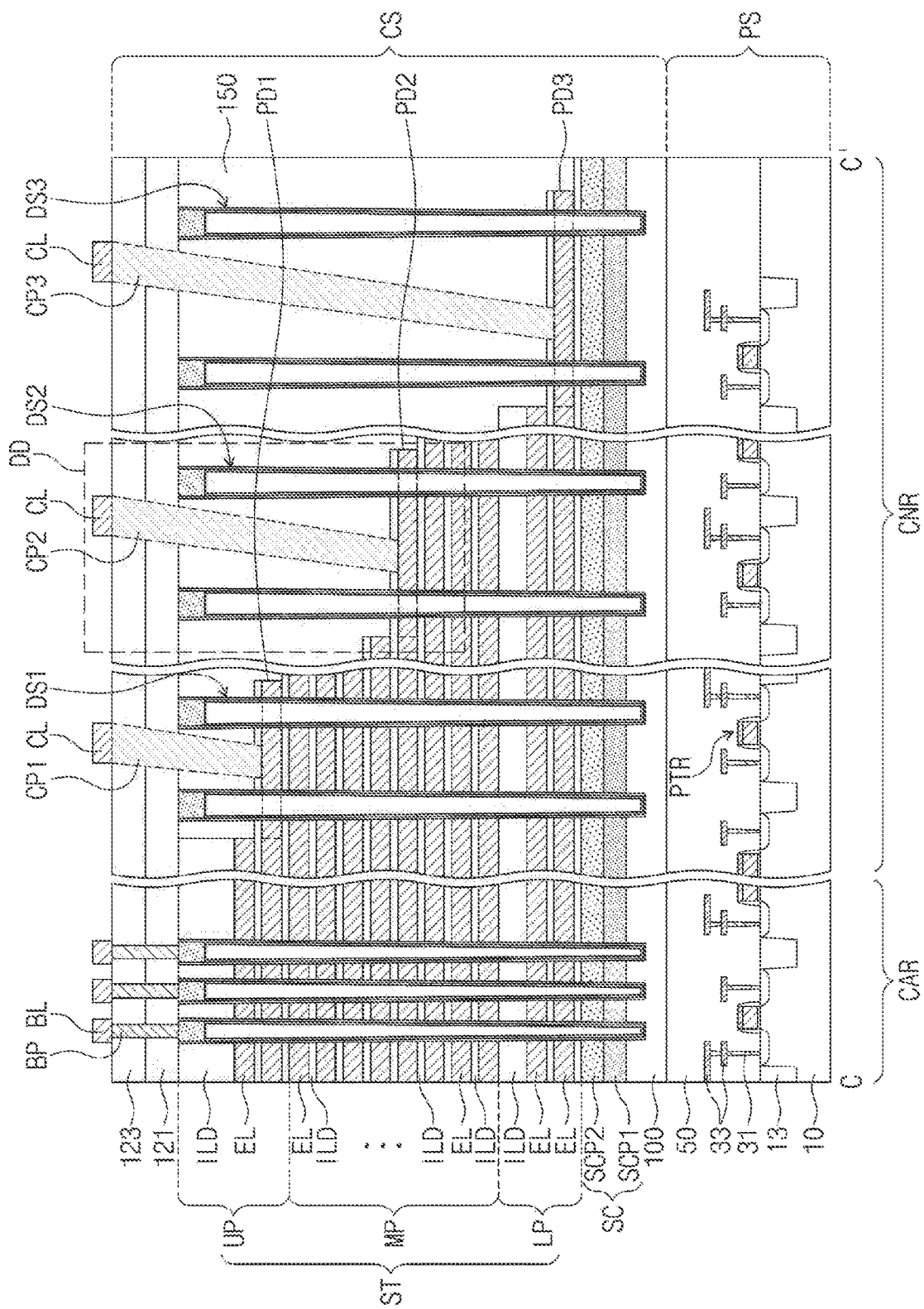
FIG. 10 illustrates a cross-sectional view taken along line C-C' of FIG. 9.
Figure 11:
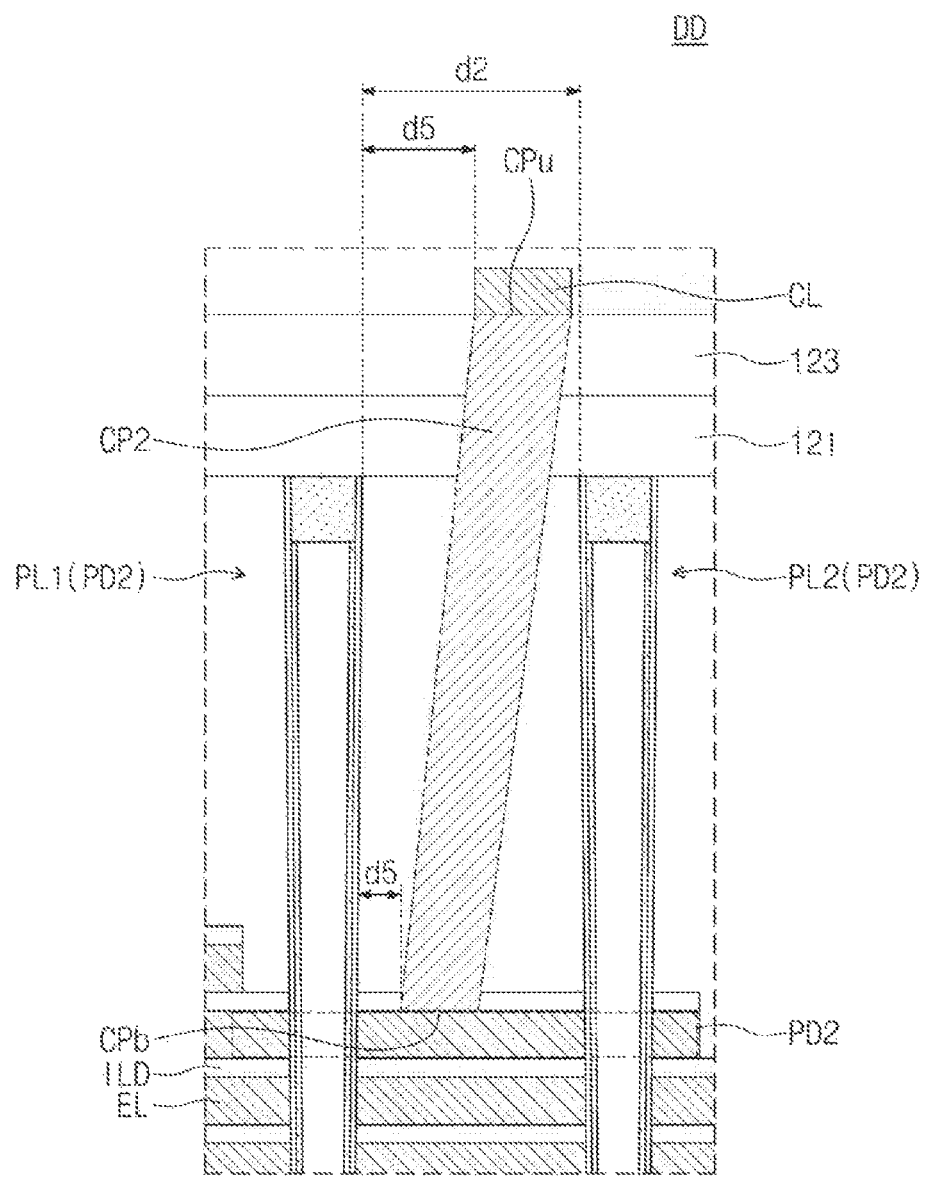
FIG. 11 illustrates an enlarged cross-sectional view showing section DD of FIG. 10.

FIG. 9 illustrates a plan view showing a semiconductor device according to some embodiments of the present inventive concepts. FIG. 10 illustrates a cross-sectional view taken along line C-C' of FIG. 9. FIG. 11 illustrates an enlarged cross-sectional view showing section DD of FIG. 10. Omission will be made to avoid explanations of components similar to those discussed above.

According to some embodiments, the vertical structures DS1, DS2, and DS3 may be spaced apart at certain distances from distal ends ed1, ed2, and ed3 of the pad sections PD1, PD2, and PD3 positioned below the vertical structures DS1, DS2, and DS3. The distal ends ed1, ed2, and ed3 extend in the first direction D1. For example, a minimum distance between the first vertical structure DS1 and a first distal end ed1 may be the same as that between the second vertical structure DS2 and a second distal end ed2 and that between the third vertical structure DS3 and a third distal end ed3. In such a case, the pad sections PD1, PD2, and PD3 may have the same length in the first direction D1 at their outer areas where neither the vertical structures DS1, DS2, and DS3 nor the contact plugs CP1, CP2, and CP3 are located.

Referring to FIGS. 9 to 11, the contact plugs CP1, CP2, and CP3 may be inclined relative to the top surface of the lower semiconductor layer 100. The smaller the distance between each of the contact plugs CP1, CP2, and CP3 and its corresponding one of the pad sections PD1, PD2, and PD3, the smaller the interval between each of the contact plugs CP1, CP2, and CP3 and the cell array region CAR. For example, as shown in FIG. 11, a pair of second vertical structures DS2 may have a first pillar PL1 and a second pillar PL2 that is closer than the first pillar PL1 to the distal end ed2 of the second pad section PD2. A distance d5 in the first direction D1 between the second contact plug CP2 and the first pillar PL1 may decrease in a direction from a top surface CPu to a bottom surface CPb of the second contact plug CP2.

The distances d1, d2, and d3 each of which is positioned between a pair corresponding ones of the vertical structures DS1, DS2, and DS3 spaced apart from each other in the first direction D1 may depend on vertical lengths of the contact plugs CP1, CP2, and CP3 each of which is located between a pair of corresponding ones of the vertical structures DS1, DS2, and DS3. Therefore, it may be possible to prevent defects due to contact between the contact plugs CP1, CP2, and CP3 and the vertical structures DS1, DS2, and DS3.

Figure 12A:
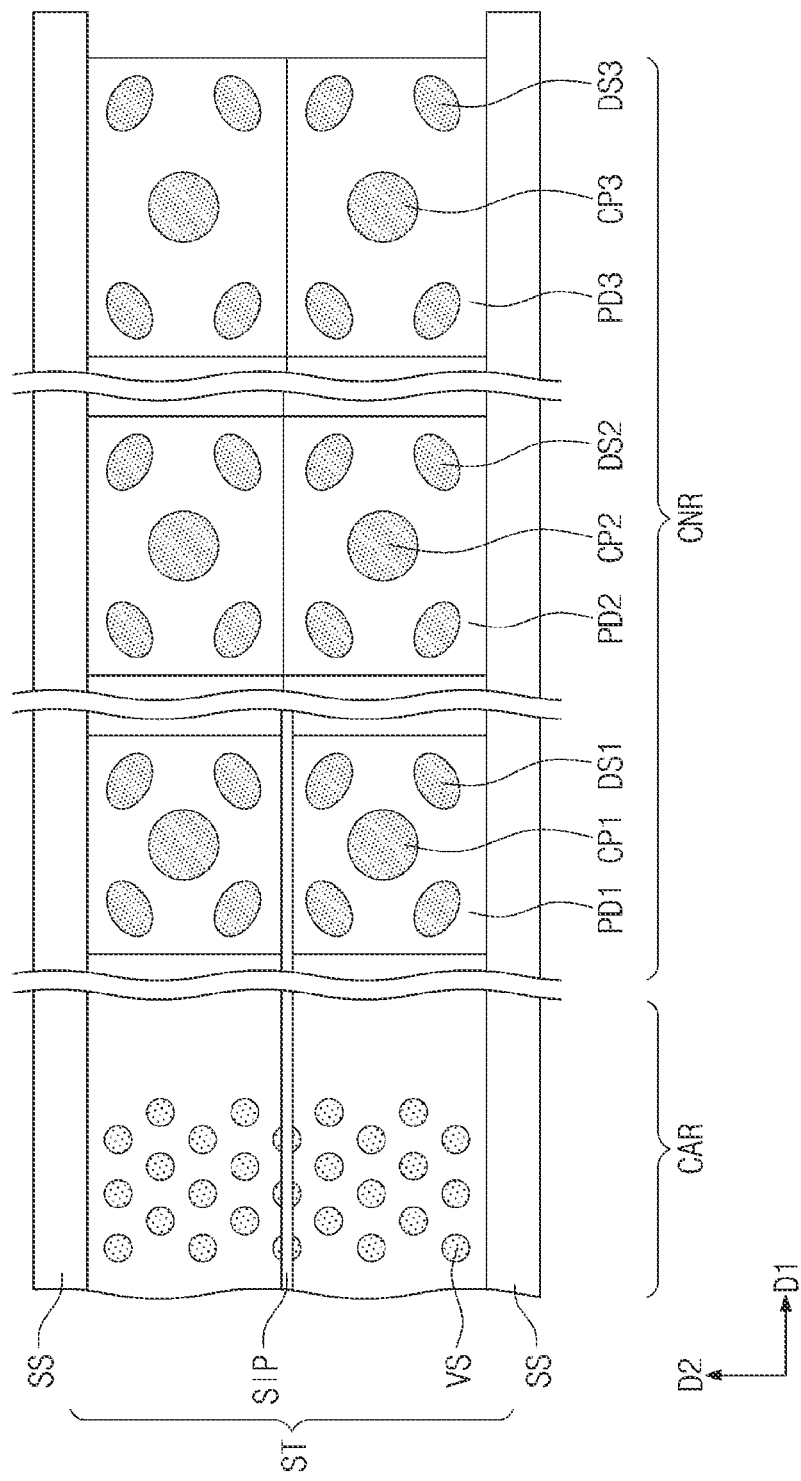
Figure 12B:
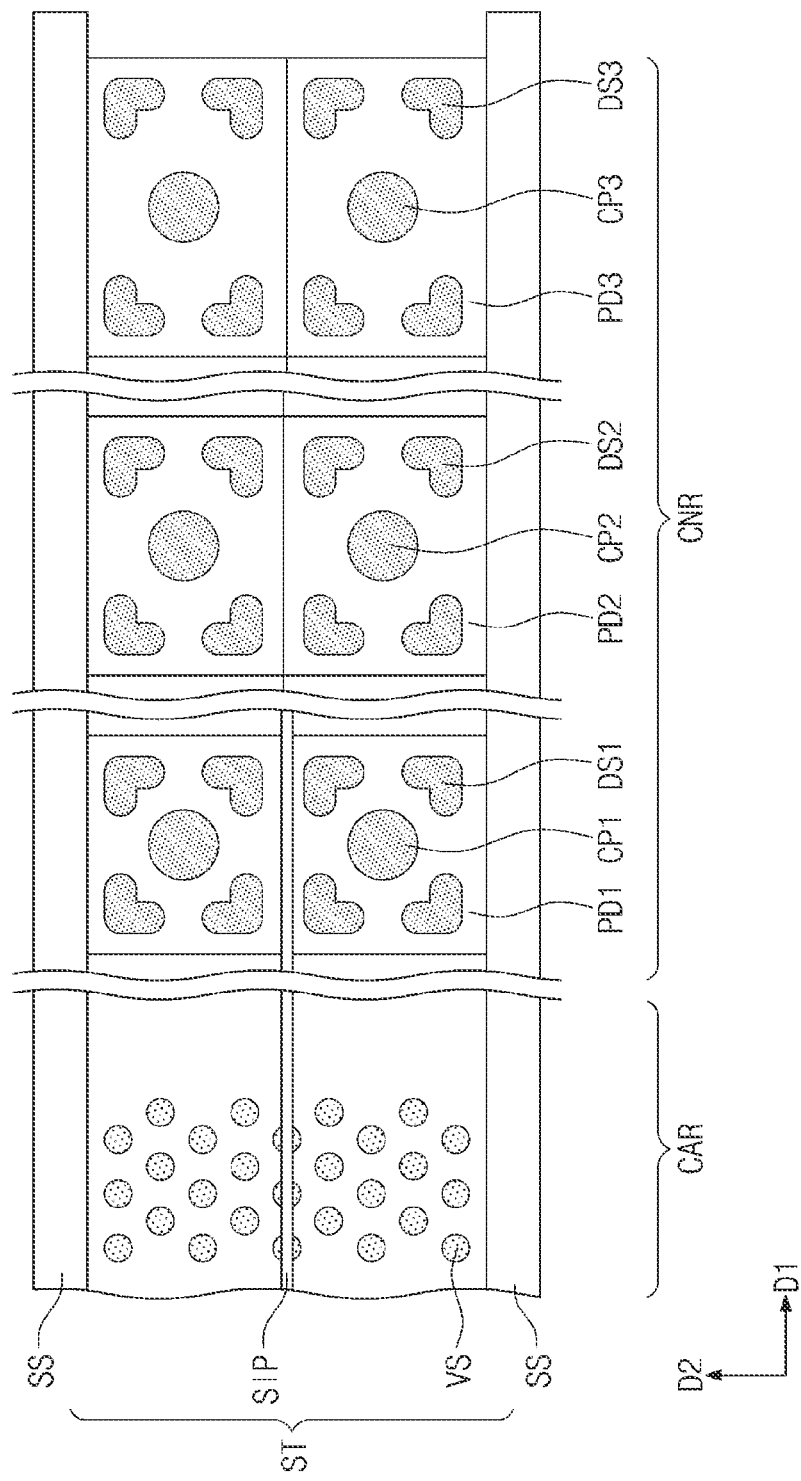

FIGS. 12A to 12C illustrate plan views showing a semiconductor device according to some embodiments of the present inventive concepts. Omission will be made to avoid explanations of components similar to those discussed above.

Referring to FIG. 12A, when viewed in plan, each of the vertical structures DS1, DS2, and DS3 may have an oval shape whose major axis extends obliquely to the first and second directions D1 and D2. The vertical structures DS1, DS2, and DS3 may be arranged to respectively surround the contact plugs CP1, CP2, and CP3.

Referring to FIG. 12B, when viewed in plan, each of the vertical structures DS1, DS2, and DS3 may include protrusions that extend in the first and second directions D1 and D2. Each of the vertical structures DS1, DS2, and DS3 may have an L shape. The vertical structures DS1, DS2, and DS3 may be arranged to respectively surround the contact plugs CP1, CP2, and CP3.

Referring to FIG. 12C, when viewed in plan, each of the contact plugs CP1, CP2, and CP3 may have an oval shape whose major axis extends in the second direction D2. Each of the contact plugs CP1, CP2, and CP3 may have a width w2 in the second direction D2 that is greater than a width w3 in the first direction D 1.

Figure 13:
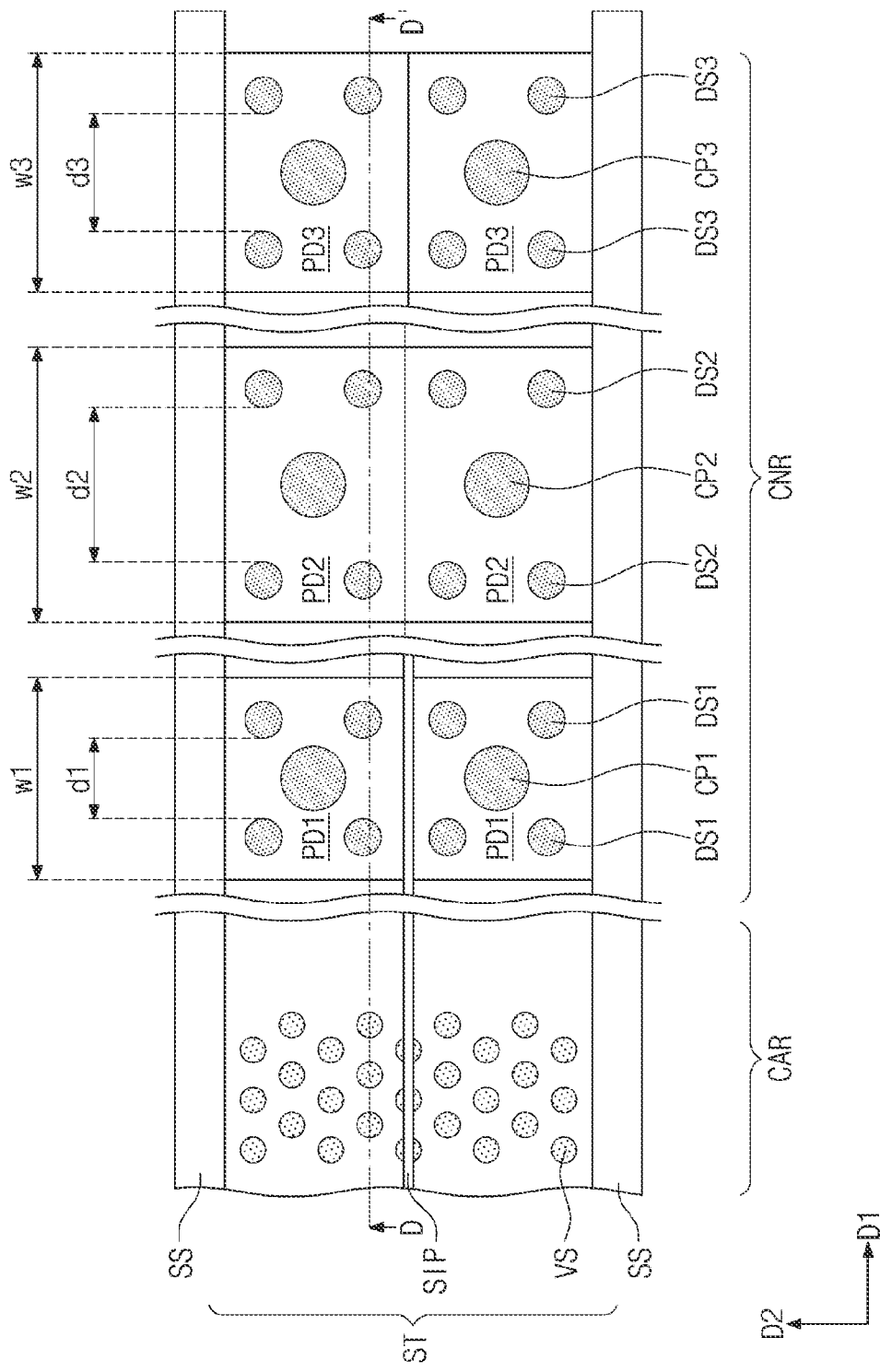
FIG. 13 illustrates a plan view showing a semiconductor device according to some embodiments of the present inventive concepts.
Figure 14:
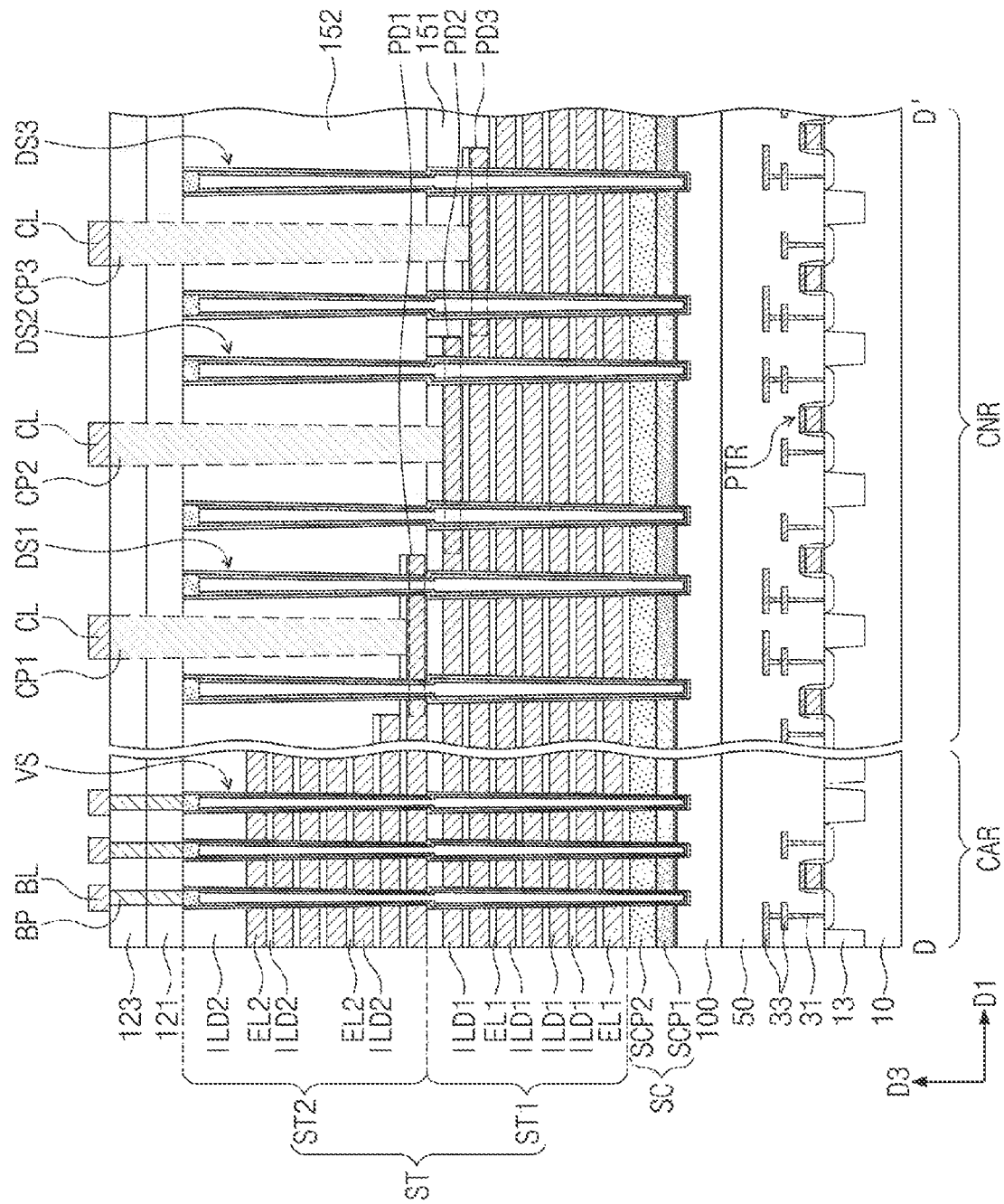
FIG. 14 illustrates a cross-sectional view taken along line D-D' of FIG. 13.

FIG. 13 illustrates a plan view showing a semiconductor device according to some embodiments of the present inventive concepts. FIG. 14 illustrates a cross-sectional view taken along line D-D' of FIG. 13. Omission will be made to avoid explanations of components similar to those discussed above.

Referring to FIGS. 13 and 14, the electrode structure ST may include a lower electrode structure ST1 and an upper electrode structure ST2 on the lower electrode structure ST1. The lower electrode structure ST1 may include first dielectric layers ILD1 and first electrodes EL1 that are alternately stacked in the third direction D3. The upper electrode structure ST2 may include second dielectric layers ILD2 and second electrodes EL2 that are alternately stacked in the third direction D3. An uppermost one of the second dielectric layers ILD2 in the upper electrode structure ST2 may be thicker than its underlying first dielectric layers ILD1 and the second dielectric layers ILD2. The first dielectric layer ILD1 between an uppermost first electrode EL1 of the lower electrode structure ST1 and a lowermost second electrode EL2 of the upper electrode structure ST2 may be thicker than the first dielectric layers ILD1 positioned below the first dielectric layer ILD1. Distal ends of the lower electrode structure ST1 may be covered with a lower planarized dielectric layer 151, and distal ends of the upper electrode structure ST2 may be covered with an upper planarized dielectric layer 152.

The channel structures VS may penetrate the electrode structure ST on the cell array region CAR. The channel structures VS may each have a diameter that decreases in a direction from a top surface of the upper electrode structure ST2 toward a bottom surface of the upper electrode structure ST2. The channel structures VS may each have a diameter that decreases in a direction from a top surface of the lower electrode structure ST1 (or a top surface of an uppermost first dielectric layer ILD1) to a bottom surface of the lower electrode structure ST1. Each of the channel structures VS may have a stepped part whose diameter is discontinuously changed at a boundary between the lower electrode structure ST1 and the upper electrode structure ST2.

The vertical structures DS1, DS2, and DS3 may penetrate the electrode structure ST on the connection region CNR. The vertical structures DS1, DS2, and DS3 may have diameters that are greater than those of the channel structures VS. Each of the vertical structures DS1, DS2, and DS3 may have a stepped part whose diameter is discontinuously changed at a boundary between the lower electrode structure ST1 and the upper electrode structure ST2.

The electrode structure ST may have a first pad section PD1, a third pad section PD3 at a lower level than that of the first pad section PD1, and a second pad section PD2 between the first pad section PD1 and the third pad section PD3. The first pad section PD1 may be formed at the same level as that of a lowermost second electrode EL2. The second pad section PD2 may be formed at the same level as that of an uppermost first electrode ELL The third pad section PD3 may be formed at the same level as that of the first electrode EL1 positioned immediately below the uppermost first electrode ELL According to some embodiments, the first pad section PD1 may have a length w1 in the first direction D1 less than a length w2 in the first direction D1 of the second pad section PD2. In addition, the length w2 in the first direction D1 of the second pad section PD2 may be greater than a length w3 in the first direction D1 of the third pad section PD3.

The first vertical structures DS1 may penetrate the first pad section PD1 and its underlying first electrodes ELL A pair of first vertical structures DS 1 may be spaced apart from each other in the first direction D1 at a first distance d1. The second vertical structures DS2 may penetrate the second pad section PD2 and its underlying first electrodes ELL A pair of second vertical structures DS2 may be spaced apart from each other in the first direction D1 by a second distance d2. The third vertical structures DS3 may penetrate the third pad section PD3 and its underlying first electrodes ELL A pair of third vertical structures DS3 may be spaced apart from each other in the first direction D1 by a third distance d3. In this case, the second distance d2 may be greater that first distance d1 and the third distance d3, and the third distance d3 may be greater than the first distance d1.

Figure 15:
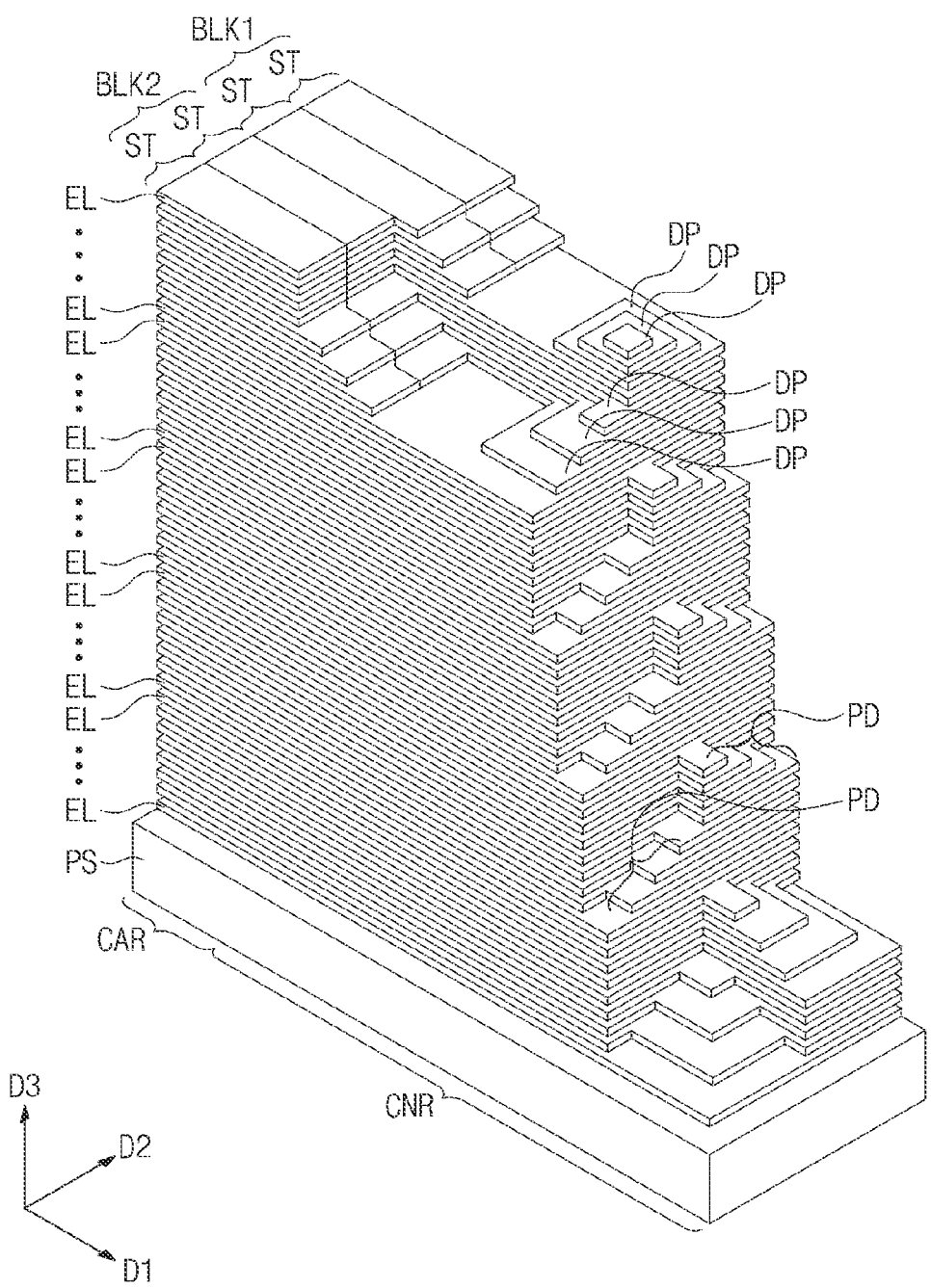
FIG. 15 illustrates a simplified perspective view showing an electrode structure of a semiconductor device according to some embodiments of the present inventive concepts.
Figure 16:
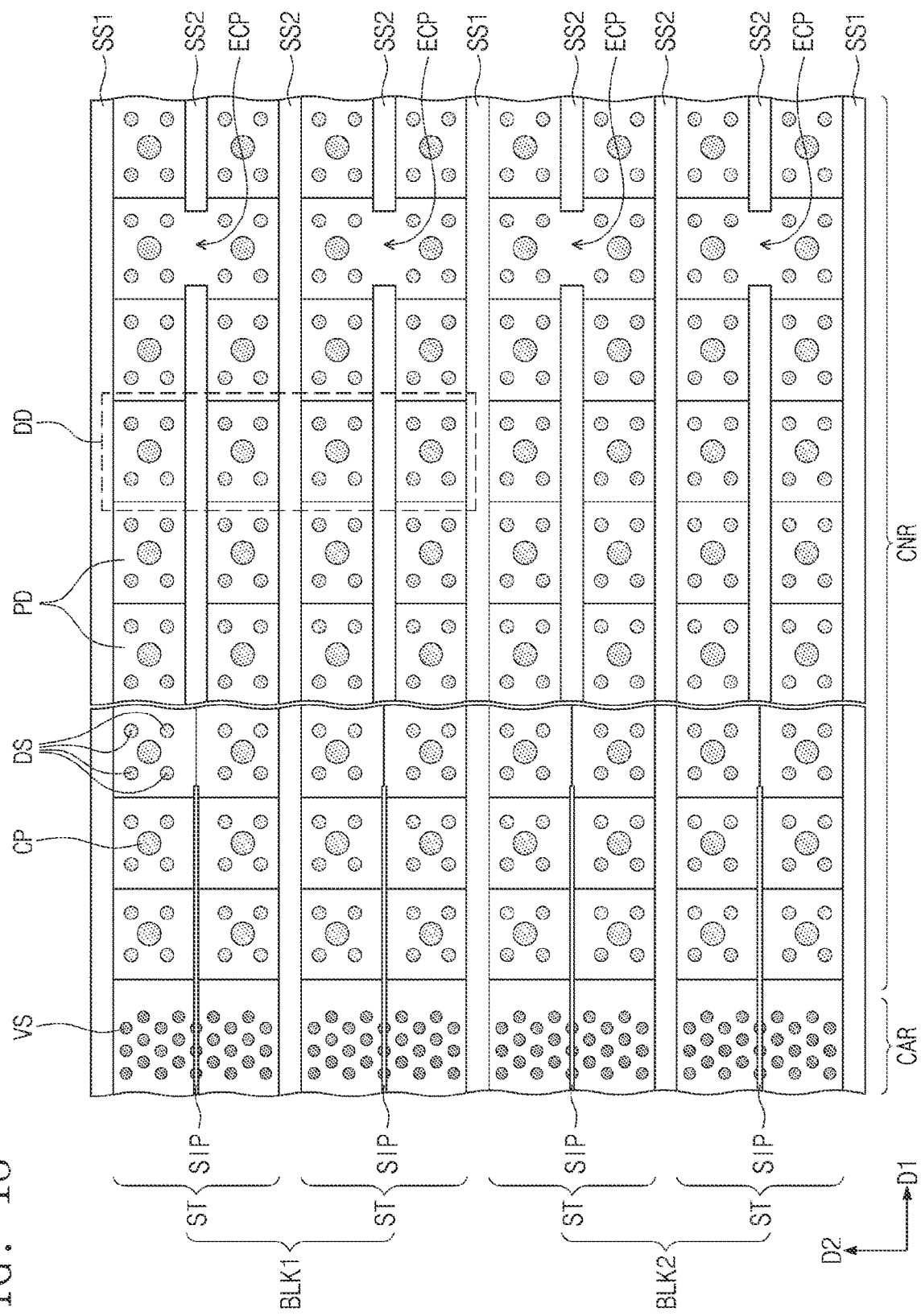
FIG. 16 illustrates a plan view showing a semiconductor device according to some embodiments of the present inventive concepts.
Figure 17:
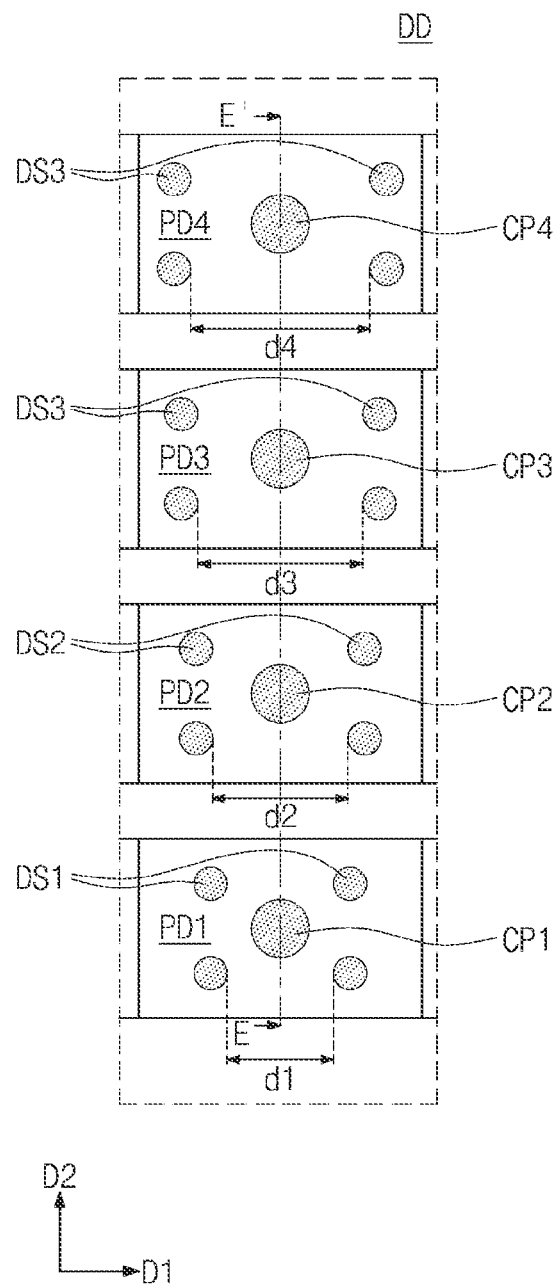
FIG. 17 illustrates an enlarged cross-sectional view showing section DD of FIG. 16.
Figure 18:
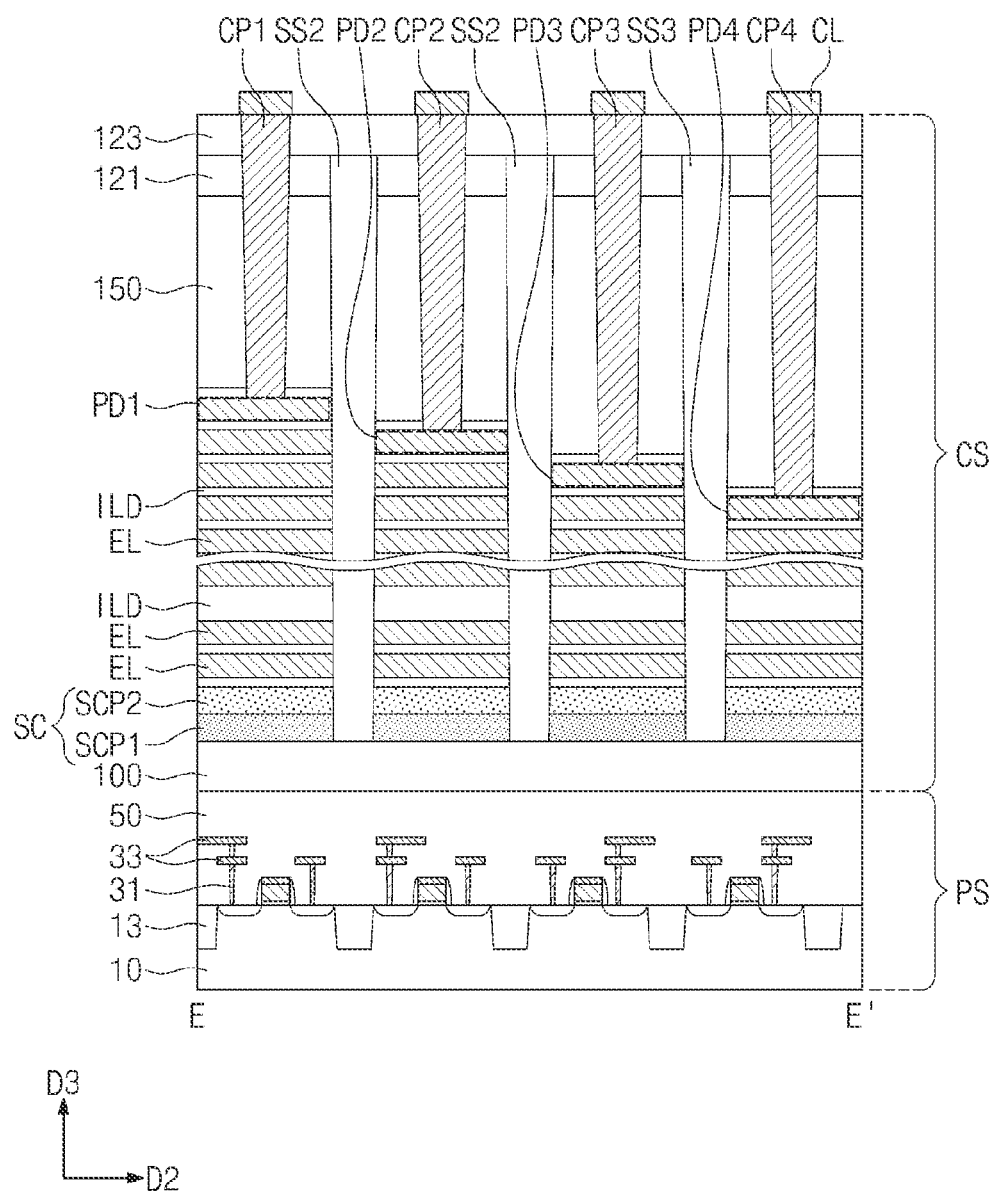
FIG. 18 illustrates a cross-sectional view taken along line E-E' of FIG. 17.

FIG. 15 illustrates a simplified perspective view showing an electrode structure of a semiconductor device according to some embodiments of the present inventive concepts. FIG. 16 illustrates a plan view showing a semiconductor device according to some embodiments of the present inventive concepts. FIG. 17 illustrates an enlarged cross-sectional view showing section DD of FIG. 16. FIG. 18 illustrates a cross-sectional view taken along line E-E' of FIG. 17. Omission will be made to avoid explanations of components similar to those discussed above.

Referring to FIGS. 15 and 16, a semiconductor device according to some embodiments of the present inventive concepts may include a first block BLK1 and a second block BLK2 that are parallel extend in the first direction D1. Each of the first and second blocks BLK1 and BLK2 may be positioned between two major separation structures SS1 that parallel extend in the first direction D1. The first and second blocks BLK1 and BLK2 may be spaced apart from each other in the second direction D2 across one major separation structure SS1. The major separation structures SS1 may completely run in the first direction D1 across the cell array region CAR and the connection region CNR. According to some embodiments, each of the first and second blocks BLK1 and BLK2 may include two electrode structures ST that parallel extend in the first direction D1.

Each of the first and second blocks BLK1 and BLK2 may have pad sections PD and dummy pad sections DP on the connection region CNR. The pad sections PD may be arranged stepwise in the first and second directions D1 and D2. The pad sections PD may be located at their levels that are lowered with increasing distance in the first direction D1 from the cell array region CAR. The pad sections PD of the first block BLK1 may be located at their levels that are lowered with increasing in the second direction D2 from the second block BLK2. The pad sections PD of the second block BLK2 may be located at their levels that are lowered with increasing in the second direction D2 from the first block BLK1. The dummy pad sections DP may be located at their levels the same as those of an uppermost electrode EL and ones of the electrodes EL. The dummy pad sections DP may not be electrically connected to the electrodes EL.

Minor separation structures SS2 may be formed in the first block BLK1 and the second block BLK2. The minor separation structures SS2 may at least partially run across either the electrode structures ST or spaces between the electrode structures ST. An electrode connector ECP may be formed between the minor separation structures SS2 and may connect two neighboring pad sections PD that are adjacent to each other in the second direction D2.

Referring to FIGS. 16 to 18, the electrode structures ST in the first block BLK1 may include first, second, third, and fourth pad sections PD1, PD2, PD3, and PD4 located at their levels that are lowered with increasing distance in the second direction D2 from the second block BLK2. First, second, third, and fourth vertical structures DS1, DS2, DS3, and DS4 may be respectively provided on the first, second, third, and fourth pad sections PD1, PD2, PD3, and PD4. The first, second, third, and fourth vertical structures DS1, DS2, DS3, and DS4 may respectively penetrate the first, second, third, and fourth pad sections PD1, PD2, PD3, and PD4, as discussed with reference to FIGS. 5 and 6.

The first, second, third, and fourth pad sections PD1, PD2, PD3, and PD4 may have the same length in the first direction D1 and the same width in the second direction D2. For example, the first, second, third, and fourth pad sections PD1, PD2, PD3, and PD4 may have the same area at top surfaces thereof. A pair of first vertical structures DS1 that face each other in the first direction D1 may be spaced apart from each other at a first distance d1. A pair of second vertical structures DS2 that face each other in the first direction D1 may be spaced apart from each other by a second distance d2 that is greater than the first distance d1. A pair of third vertical structures DS3 that face each other in the first direction D1 may be spaced apart from each other by a third distance d3 that is greater than the second distance d2. A pair of fourth vertical structures DS4 that face each other in the first direction D1 may be spaced apart from each other at a fourth distance d4 that is greater than the third distance d3.

Figure 19:
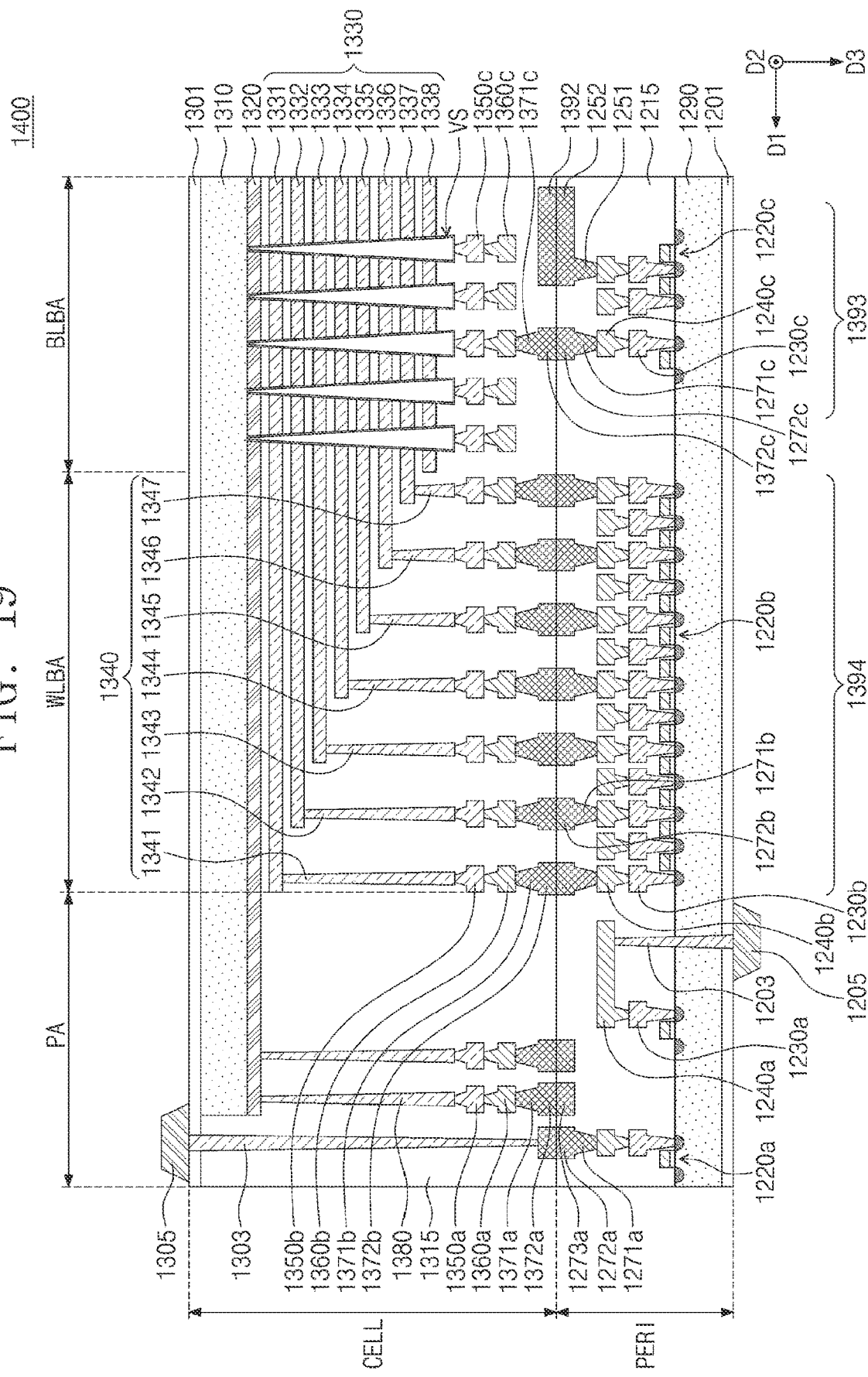
FIG. 19 illustrates a cross-sectional view showing a semiconductor device according to some embodiments of the present inventive concepts.

FIG. 19 illustrates a cross-sectional view showing a semiconductor device according to some embodiments of the present inventive concepts.

Referring to FIG. 19, a memory device 1400 may have a chip-to-chip (C2C) structure. The chip-to-chip (C2C) structure may be fabricated by forming on a first wafer an upper chip including a cell array structure CELL; forming, on a second wafer different from the first wafer, a lower chip including a peripheral circuit structure PERI; and then using a bonding method to connect the upper and lower chips to each other. For example, the bonding method may include electrically connecting a bonding metal formed on an uppermost metal layer of the upper chip to a bonding metal formed on an uppermost metal layer of the lower chip. For example, when the bonding metal is formed of copper (Cu), the bonding method may be a Cu-to-Cu bonding method, and the bonding metal may be formed of aluminum (Al) or tungsten (W).

Each of the peripheral circuit structure PERI and the cell array structure CELL of the memory device 1400 may include an outer pad bonding region PA, a word-line bonding region WLBA, and a bit-line bonding region BLBA.

The peripheral circuit structure PERI may include a first substrate 1290, an interlayer dielectric layer 1215, a plurality of circuit elements 1220a, 1220b, and 1220c formed on the first substrate 1290, first metal layers 1230a, 1230b, and 1230c respectively connected to the plurality of circuits elements 1220a, 1220b, and 1220c, and second metal layers 1240a, 1240b, and 1240c respectively formed on the first metal layers 1230a, 1230b, and 1230c. In some embodiments, the first metal layers 1230a, 1230b, and 1230c may be formed of tungsten whose electrical resistivity is relatively higher, and the second metal layers 1240a, 1240b, and 1240c may be formed of copper whose electrical resistivity is relatively lower.

The first metal layers 1230a, 1230b, and 1230c and the second metal layers 1240a, 1240b, and 1240c are illustrated and explained in this description, but the present inventive concepts are not limited thereto, and one or more metal layers may further be formed on the second metal layers 1240a, 1240b, and 1240c. At least one of the metal layers formed on the second metal layers 1240a, 1240b, and 1240c may be formed of aluminum whose electrical resistivity is less than that of copper used for forming the second metal layers 1240a, 1240b, and 1240c.

The interlayer dielectric layer 1215 may be disposed on the first substrate 1290 and cover the plurality of circuit elements 1220a, 1220b, and 1220c, the first metal layers 1230a, 1230b, and 1230c, and the second metal layers 1240a, 1240b, and 1240c, and may include a dielectric material, such as silicon oxide or silicon nitride.

A lower bonding metal 1271b and 1272b may be formed on the second metal layer 1240b of the word-line bonding region WLBA. The word-line bonding region WLBA may correspond to the connection region CNR discussed with reference to FIG. 5. On the word-line bonding region WLBA, the lower bonding metal 1271b and 1272b of the peripheral circuit structure PERI may be electrically bonded and connected to an upper bonding metal 1371b and 1372b of the cell array structure CELL, and the lower bonding metal 1271b and 1272b and the upper bonding metal 1371b and 1372b may be formed of aluminum, copper, or tungsten.

The cell array structure CELL may provide at least one memory block. The cell array structure CELL may include a second substrate 1310 and a common source line 1320. The second substrate 1310 may be provided thereon with a plurality of electrodes 1331 to 1338 (or 1330) that are stacked along a direction perpendicular to a top surface of the second substrate 1310. On the bit-line bonding region BLBA, a channel structure VS may penetrate the plurality of electrodes 1330, while extending in the direction perpendicular to the top surface of the second substrate 1310. The channel structure VS may include a data storage layer, a channel layer, and a filling dielectric layer, and the channel layer may be electrically connected to a first metal layer 1350c and a second metal layer 1360c. For example, the first metal layer 1350c may be a bit-line contact, and the second metal layer 1360c may be a bit line.

The bit-line bonding region BLBA may be defined to refer to a zone where the channel structure VS and the bit line 1360c are disposed, and may correspond to the cell array region CAR discussed with reference to FIG. 5. The bit line 1360c may be electrically connected to the circuit element 1220c that provides a page buffer 1393 on the peripheral circuit structure PERI adjacent to the bit-line bonding region BLBA. For example, the bit line 1360c may have connection through an upper bonding metal 1371c and 1372c with the peripheral circuit structure PERI, and the upper bonding metal 1371c and 1372c may have connection with a lower bonding metal 1271c and 1272c connected to the circuit elements 1220c of the page buffer 1393.

On the word-line bonding region WLBA, the electrodes 1330 may extend along a first direction D1 parallel to the top surface of the second substrate 1310, and may be connected to the plurality of cell contact plugs 1341 to 1347 (or 1340). The electrodes 1330 and the cell contact plugs 1340 may be connected at pad sections that are at least portions of the electrodes 1330 and that extend to have different lengths along the first direction D1. A first metal layer 1350b and a second metal layer 1360b may be sequentially connected to upper portions of the cell contact plugs 1340 connected to the electrodes 1330. On the word-line bonding region WLBA, the cell contact plugs 1340 may be connected to the peripheral circuit structure PERI through the upper bonding metal 1371b and 1372b of the cell array structure CELL and through the lower bonding metal 1271b and 1272b of the peripheral circuit structure PERI.

The cell contact plugs 1340 may be electrically connected to the circuit elements 1220b that form a row decoder 1394 on the peripheral circuit structure PERI. In some embodiments, an operating voltage of the circuit elements 1220b that form the row decoder 1394 may be different from that of the circuit elements 1220c that form the page buffer 1393. For example, the operating voltage of the circuit elements 1220c that form the page buffer 1393 may be greater than that of the circuit elements 1220b that form the row decoder 1394.

A common source line contact plug 1380 may be disposed on an outer pad bonding region PA. The common source line contact plug 1380 may be formed of a conductive material, such as metal, metal compound, or polysilicon, and may be electrically connected to the common source line 1320. A first metal layer 1350a and a second metal layer 1360a may be sequentially stacked on an upper portion of the common source line contact plug 1380. For example, the outer pad bonding region PA may be defined to refer to a zone where are disposed the common source line contact plug 1380, the first metal layer 1350a, and the second metal layer 1360a.

Input/output pads 1205 and 1305 may be disposed on the outer pad bonding region PA. A lower dielectric layer 1201 may be formed to cover a bottom surface of the first substrate 1290, and a first input/output pad 1205 may be formed on the lower dielectric layer 1201. The first input/output pad 1205 may be connected through a first input/output contact plug 1203 to at least one of the plurality of circuit elements 1220a, 1220b, and 1220c disposed on the peripheral circuit structure PERI, and the lower dielectric layer 1201 may separate the first input/output pad 1205 from the first substrate 1290. In addition, a sidewall dielectric layer may be disposed between the first input/output contact plug 1203 and the first substrate 1290, and may electrically separate the first input/output contact plug 1203 from the first substrate 1290.

An upper dielectric layer 1301 may be formed to cover a top surface of the second substrate 1310, and a second input/output pad 1305 may be disposed on the upper dielectric layer 1301. The second input/output pad 1305 may be connected through a second input/output contact plug 1303 to at least one of the plurality of circuit elements 1220a, 1220b, and 1220c disposed on the peripheral circuit structure PERI. In some embodiments, the second input/output pad 1305 may be electrically connected to the circuit element 1220a.

In some embodiments, neither the second substrate 1310 nor the common source line 1320 may be located on an area where the second input/output contact plug 1303 is disposed. In addition, the second input/out pad 1305 may not overlap in a third direction D3 with the electrodes 1330. When viewed in a direction perpendicular to the top surface of the second substrate 1310, the second input/output contact plug 1303 may be separated from the second substrate 1310, and may penetrate an interlayer dielectric layer 1315 of the cell array structure CELL to come into connection with the second input/output pad 1305.

In some embodiments, the first input/output pad 1205 and the second input/output pad 1305 may be selectively formed. For example, the memory device 1400 may include only the first input/output pad 1205 disposed on an upper portion of the first substrate 1290, or only the second input/output pad 1305 disposed on an upper portion of the second substrate 1310. For another example, the memory device 1400 may include all of the first input/output pad 1205 and the second input/output pad 1305.

On each of the outer pad bonding region PA and the bit-line bonding region BLBA that are included in each of the cell array structure CELL and the peripheral circuit structure PERI, an uppermost metal layer may include a metal pattern present as a dummy pattern, or no uppermost metal layer may be present.

The memory device 1400 may be configured such that, on the outer pad bonding region PA, a lower metal pattern 1273a may be formed to correspond to an upper metal pattern 1372a formed at an uppermost metal layer of the cell array structure CELL, and that the lower metal pattern 1273a may have the same shape as that of the upper metal pattern 1372a. The lower metal pattern 1273a formed at the uppermost metal layer of the peripheral circuit structure PERI may not be connected to a separate contact on the peripheral circuit structure PERI Similarly, on the outer pad bonding region PA, an upper metal pattern 1372a may be formed at an upper metal layer of the cell array structure CELL, which upper metal pattern 1372a may correspond to and have the same shape as that of the lower metal pattern 1273a formed at an uppermost metal layer of the peripheral circuit structure PERI.

A lower bonding metal 1271b and 1272b may be formed on the second metal layer 1240b of the word-line bonding region WLBA. On the word-line bonding region WLBA, the lower bonding metal 1271b and 1272b of the peripheral circuit structure PERI may be bonded to and electrically connected to the upper bonding metal 1371b and 1372b of the cell array structure CELL.

Moreover, on the bit-line bonding region BLBA, an upper metal pattern 1392 may be formed at an uppermost metal layer of the cell array structure CELL, which upper metal pattern 1392 may correspond to and have the same shape as that of a lower metal pattern 1252 formed at an uppermost metal layer of the peripheral circuit structure PERI. No contact may be formed on the upper metal pattern 1392 formed at the uppermost metal layer of the cell array structure CELL.

According to some embodiments of the present inventive concepts, vertical structures that penetrate pad sections may be arranged at different intervals based on positions of the pad sections, and thus it may be possible to prevent defects caused by contact between contact plugs and the vertical structures. Accordingly, a semiconductor device and an electronic device may increase in reliability and electrical characteristics.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
   a substrate that includes a cell array region and a connection region;
   an electrode structure that extends in a first direction on the substrate, the electrode structure including a plurality of electrodes that are vertically stacked, the electrodes having pad sections that are arranged stepwise on the connection region;
   a first contact plug connected to a first one of the pad sections;
   a pair of first vertical structures that penetrate the first one of the pad sections and are spaced apart from each other in the first direction by a first distance;
   a second contact plug connected to a second one of the pad sections and having a vertical length that is greater than a vertical length of the first contact plug; and
   a pair of second vertical structures that penetrate the second one of the pad sections and are spaced apart from each other in the first direction by a second distance,
   wherein the second distance is greater than the first distance.

2. The semiconductor device of claim 1, wherein the pair of first vertical structures and the pair of second vertical structures are aligned in the first direction.

3. The semiconductor device of claim 1, wherein the second one of the pad sections has a length in the first direction that is greater than a length in the first direction of the first one of the pad sections.

4. The semiconductor device of claim 1, further comprising a plurality of channel structures that vertically penetrate the electrodes on the cell array region,
   wherein the pair of first vertical structures and the pair of second vertical structures have a width in the first direction that is greater than a width in the first direction of the channel structures.

5. The semiconductor device of claim 1, further comprising a separation dielectric pattern that extends in the first direction across ones of the electrodes, the ones of the electrodes being on an upper portion of the electrode structure,
   wherein a bottom end of the first contact plug is at a level higher than a level of a bottom end of the separation dielectric pattern, and
   wherein a bottom end of the second contact plug is at a level lower than the level of the bottom end of the separation dielectric pattern.

6. The semiconductor device of claim 1, further comprising another pair of first vertical structures penetrating the first one of the pad sections,
   wherein the pair of first vertical structures are spaced apart in a second direction by a third distance from the another pair of first vertical structures, the second direction being orthogonal to the first direction,
   wherein the third distance is less than the first distance and the second distance.

7. The semiconductor device of claim 1, wherein the pad sections have distal ends that extend in the first direction,
   wherein a minimum distance between the distal end of the first one of the pad sections and the pair of first vertical structures is the same as a minimum distance between the distal end of the second one of the pad sections and the pair of second vertical structures.

8. The semiconductor device of claim 1, wherein the first contact plug has a width in the first direction that is less than the first distance and the second distance.

9. The semiconductor device of claim 1, wherein the pair of second vertical structures include a first supporter and a second supporter that are spaced apart in the first direction from the first supporter, the second supporter extending toward a distal end of the second one of the pad sections,
   wherein a top end of the second contact plug is closer to the second supporter than to the first supporter, and
   wherein a bottom end of the second contact plug is closer to the first supporter than to the second supporter.

10. The semiconductor device of claim 1, wherein
    the first one of the pad sections and the second one of the pad sections are at a same distance in the first direction from the cell array region,
    the first one of the pad sections and the second one of the pad sections are spaced apart from each other in a second direction orthogonal to the first direction,
    the first direction and the second direction are located at positions horizontally different from each other, and
    the first one of the pad sections does not overlap the second one of the pad sections.

11. The semiconductor device of claim 1, wherein the first one of the pad sections and the second one of the pad sections have the same length in the first direction.

12. The semiconductor device of claim 1, wherein the pad sections have distal ends that extend in the first direction,
    wherein a minimum distance between the distal end of the first one of the pad sections and the pair of first vertical structures is greater than a minimum distance between the distal end of the second one of the pad sections and the pair of second vertical structures.

13. The semiconductor device of claim 1, wherein the pad sections include a third pad section electrically connected to a lowermost one of the electrodes,
    wherein the semiconductor device further comprises:
    a third contact plug connected to the third pad section that is at a vertical level lower than a vertical level of the second one of the pad sections; and
    a pair of third vertical structures that penetrate the third pad section and are spaced apart from each other in the first direction at a third distance,
    wherein the third distance is greater than the second distance.

14. A semiconductor device, comprising:
    a substrate that includes a cell array region and a connection region;

an electrode structure that extends in a first direction on the substrate, the electrode structure including a plurality of electrodes and a plurality of dielectric layers that are alternately stacked, the electrodes having pad sections that are arranged stepwise on the connection region;

a plurality of channel structures that penetrate the electrodes on the cell array region;

a separation dielectric pattern that extends in the first direction between the channel structures, the separation dielectric pattern penetrating ones of the electrodes, the ones of the electrodes being on an upper portion of the electrode structure;

a first contact plug connected to a first one of the pad sections, the first one of the pad sections being at a level higher than a level of a bottom end of the separation dielectric pattern;

at least a pair of first vertical structures that penetrate the first one of the pad sections and are spaced apart from each other in the first direction;

a second contact plug electrically connected to a lowermost one of the electrodes, the second contact plug being connected to a second one of the pad sections; and at least a pair of second vertical structures that penetrate the second one of the pad sections and are spaced apart from each other in the first direction, wherein a distance in the first direction between the pair of second vertical structures is greater than a distance in the first direction between the pair of first vertical structures.

15. The semiconductor device of claim 14, further comprising a plurality of third vertical structures that are spaced apart from each other in the first direction, the third vertical structures penetrating a third one of the pad sections, wherein the third pad section is at a level lower than a level of the first one of the pad sections and higher than a level of the second one of the pad sections, wherein a distance in the first direction between the plurality of third vertical structures is greater than the distance in the first direction between the pair of first vertical structures and less than the distance in the first direction between the pair of second vertical structures.

16. The semiconductor device of claim 14, wherein the first vertical structures and the second vertical structures have a width in the first direction that is greater than a width in the first direction of the channel structures.

17. The semiconductor device of claim 14, wherein the second one of the pad sections has a length in the first direction that is greater than a length in the first direction of the first one of the pad sections.

18. The semiconductor device of claim 14, wherein the first vertical structures and the second vertical structures are aligned in the first direction.

19. An electronic system, comprising:
a main board;
a semiconductor device on the main board; and
a controller on the main board and electrically connected to the semiconductor device,
wherein the semiconductor device comprises:
a substrate that includes a cell array region and a connection region that faces in a first direction to the cell array region;
an electrode structure that includes a plurality of electrodes stacked on the substrate, the electrode structure having a plurality of stepwise pad sections on the connection region;
a first contact plug connected to a first one of the pad sections;
a plurality of first vertical structures that penetrate the first one of the pad sections;
a second contact plug connected to a second one of the pad sections and having a vertical length that is greater than a vertical length of the first contact plug; and
a plurality of second vertical structures that penetrate the second one of the pad sections,
wherein a distance in the first direction between the plurality of second vertical structures is greater than a distance in the first direction between the plurality of first vertical structures.

20. The electronic system of claim 19, wherein the plurality of first vertical structures and the plurality of second vertical structures are aligned in the first direction.

* * * * *